(12) United States Patent
Nishiyama et al.

(10) Patent No.: US 6,503,959 B1
(45) Date of Patent: *Jan. 7, 2003

(54) PHOTOCURABLE COMPOSITION CONTAINING AN α-CYANOACRYLATE AND A METALLOCENE COMPOUND

(75) Inventors: Yuko Nishiyama, Tokyo (JP); Hiroyuki Mikuni, Tokyo (JP)

(73) Assignee: Three Bond Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/730,025

(22) Filed: Oct. 11, 1996

(30) Foreign Application Priority Data

Oct. 19, 1995 (JP) .............................. 7-296281
Jan. 12, 1996 (JP) .............................. 8-022037

(51) Int. Cl.$^7$ .............................. C08F 2/50; C09J 4/04
(52) U.S. Cl. .............................. 522/16; 522/17; 522/18; 522/24; 522/29; 522/173; 522/12; 522/20; 522/23; 522/28; 430/281.1
(58) Field of Search .............................. 522/29, 66, 170, 522/173, 18, 16, 12, 17, 24, 19, 20, 21, 22, 23, 28; 430/281.1

(56) References Cited

U.S. PATENT DOCUMENTS

| | | | | |
|---|---|---|---|---|
| 4,707,432 A | * | 11/1987 | Gatechair et al. | 522/66 |
| 4,818,325 A | * | 4/1989 | Hiraiwa et al. | 156/315 |
| 5,110,392 A | * | 5/1992 | Ito et al. | 156/314 |
| 5,389,700 A | | 2/1995 | Sasaki | |
| 5,453,450 A | * | 9/1995 | Kinzer et al. | 522/29 |
| 5,567,266 A | * | 10/1996 | Liu | 156/310 |
| 5,652,280 A | * | 7/1997 | Kutal | 522/66 |

FOREIGN PATENT DOCUMENTS

| | | | |
|---|---|---|---|
| EP | 0447930 | 9/1991 | |
| EP | 0573805 | 12/1993 | |
| JP | 7-196712 | 8/1995 | ............. C08F/2/50 |
| JP | 5-91363 | 10/1995 | ............. C08G/59/18 |
| WO | WO 93/10483 | 5/1993 | ............. G03C/1/67 |
| WO | WO9531486 | 11/1995 | |

OTHER PUBLICATIONS

*Macromolecules* 1991, 24, 6872–6873.
*Macromolecules* 1995, 28, 1328–1329.
*J. Macromol. Sci. Chem.*, A28(5&6), 557 (1991), Abstract only.

* cited by examiner

*Primary Examiner*—Susan W. Berman
(74) *Attorney, Agent, or Firm*—Sughrue Mion, PLLC

(57) ABSTRACT

A photocurable composition comprising (A) an α-cyanoacrylate and (B) a metallocene compound comprising a transition metal of Group VIII of the periodic table and aromatic electron system ligands selected from π-arenes, indenyl, η-cyclopentadienyl. The photocurable composition may further comprise (C) a cleavage-type photoinitiator. The photocurability of the photocurable composition can be greatly improved by incorporating a cleavage type photoinitiator into the composition. Even when the composition contains a radical-polymerizable compound such as an acrylic compound, it can be rapidly cured due to the cleavage type photoinitiator contained therein. In the case where the cleavage-type photoinitiator used is a peroxide, heating can also be used to cure the composition. In the case where the cleavage type photoinitiator used is an azo compound, the composition can be foamed by regulating the addition amount of the photoinitiator or the quantity of light with which the composition is irradiated.

18 Claims, No Drawings

PHOTOCURABLE COMPOSITION CONTAINING AN α-CYANOACRYLATE AND A METALLOCENE COMPOUND

FIELD OF THE INVENTION

The present invention relates to a cyanoacrylate composition having photocurability. Possible applications of the composition include lithography, potting, molding, coating, adhesives, sealing materials, and various resist materials.

BACKGROUND OF THE INVENTION

α-Cyanoacrylate adhesives are extensively utilized as cold-setting single-liquid type instantaneous adhesives for metals, plastics, rubbers, woods, etc., because they rapidly polymerize and cure by the action of a minute amount of the adsorption water present on adherend surfaces to extremely tenaciously bond the adherends to each other in a short time period.

However, the α-cyanoacrylate adhesives have a drawback that the curing is very slow when the gap between adherends is wide, when the adhesive applied has overflown from the bonding part, or when the adhesive applied is not sandwiched between a pair of adherends as in coating.

In general, a cyanoacrylate adhesive with which a large gap is filled or which has overflown from a bonding part is cured by using a primer or a curing accelerator. However, not only this technique is troublesome, but also the basic compound used as the main component of the primer or curing accelerator and the odor of the solvent contained therein are undesirable for the working environment.

There is hence a desire for a cyanoacrylate adhesive which can be easily cured without impairing the excellent features of the instantaneous adhesive, i.e., cold-setting and single-liquid type.

To eliminate the problem described above, cyanoacrylate adhesive compositions having photocurability have been proposed. For example, a cyanoacrylate adhesive composition containing a radical-generating photopolymerization initiator is disclosed in JP-A-62-57475. (The term "JP-A" as used herein means an "unexamined published Japanese patent application.")

JP-A-6-299122 discloses an adhesive composition containing an aromatic azide compound as a photoinitiator for anionic polymerization.

WO93/10483 discloses a technique in which an inorganic chromium complex is used as a photoinitiator for anionic polymerization.

Further, a technique of using $Pt(acac)_2$ as a photoinitiator for anionic polymerization is reported in *Macromolecules*, 28 (4) 1328 (1995).

These proposed compositions, however, have problems such as the following. In order for the compositions to cure, a relatively long light irradiation time of from 1 to 2 minutes is necessary. In the case of radical polymerization, the curing reaction is inhibited by oxygen and, as a result, the adhesive surface suffers curing failure or remains tacky. Moreover, the compositions foam upon light irradiation, or have poor storage stability.

On the other hand, many proposals have been made on photocurable compositions containing a metallocene compound as a photoinitiator. Metallocene compounds are generally used as a photoinitiator for radical polymerization or cationic polymerization. For example, JP-A-6-35189 discloses a photopolymerizable mixture containing a photoinitiator comprising (A) a photoreducible dye, (B) a radiation-decomposable trihalomethyl compound, and (C) a metallocene compound and a recording material produced from the mixture.

JP-A-5-117311 discloses a photopolymerization initiator comprising a complex obtained by the interaction of (A) a charge-transfer complex comprising a biscyclopentadienyliron derivative and a quinoid compound with (B) at least one salt selected from the group consisting of tetrafluoroboric acid salts, hexafluorophosphoric acid salts, and hexafluoroantimonic acid salts.

JP-A-4-221958 discloses a photopolymerizable mixture containing a metallocene compound as a photoreaction initiator and a recording material produced from the mixture.

JP-A-2-127404 discloses a photopolymerizable mixture containing a photoinitiator comprising (A) a photo-reducible dye, (B) a radiation-decomposable trihalomethyl compound, and (C) a metallocene compound and a recording material produced from the mixture.

JP-A-4-73763 discloses a photocurable electrodeposition coating composition containing a titanocene compound as an initiator.

Further, a technique of photocuring a vinyl monomer by means of ferrocene alone or a combination thereof with carbon tetrachloride is reported in *J. Macromol. Sci.-Chem.*, A28 (5&6), 557 (1991).

However, the techniques shown above are based on a polymerization mechanism in which a radical or cationic polymerization reaction proceeds, and are unrelated to the technique for photopolymerizing and curing an α-cyanoacrylate mainly by anionic polymerization, in particular to the technique of the present invention.

SUMMARY OF THE INVENTION

An object of the present invention is to provide a photocurable composition having excellent photocurability to overcome the above-described problems in the prior art.

The present inventors have found that the above object is achieved with the following embodiments:

(1) a photocurable composition comprising:
 (A) an α-cyanoacrylate and
 (B) a metallocene compound comprising a transition metal of Group VIII of the periodic table and aromatic electron system ligands;

(2) the photocurable composition according to the embodiment (1), further comprising (C) a cleavage-type photoinitiator;

(3) the photocurable composition according to the embodiment (1) or (2), wherein in the metallocene compound (B) comprising a transition metal of Group VIII of the periodic table and aromatic electron system ligands, the aromatic electron system ligands each is a π-arene, indenyl, or η-cyclopentadienyl;

(4) the photocurable composition according to any one of the embodiments (1) to (3), wherein the metallocene compound (B) comprising a transition metal of Group VIII of the periodic table and aromatic electron system ligands is represented by the following formula (I):

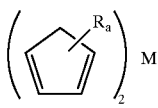

(wherein M represents a transition metal of Group VIII of the periodic table; R represents a halogen atom, a hydrocarbon group having 1 to 20 carbon atoms, a halogenated hydrocarbon group having 1 to 20 carbon atoms, or a silicon atom-containing, oxygen atom-containing, sulfur atom-containing, or phosphorus atom-containing group having 1 to 20 carbon atoms, provided that the R's may be the same or different and may be crosslinked to each other; symbol a represents an integer of from 0 to 5; and the groups [$R_a$-Cp] (Cp represents η-cyclopentadienyl) may be the same or different);

(5) the photocurable composition according to any one of the embodiments (1) to (4), wherein in the metallocene compound (B) comprising a transition metal of Group VIII of the periodic table and aromatic electron system ligands, the transition metal of Group VIII of the periodic table comprises iron, osmium, ruthenium, cobalt, or nickel; and (6) the photocurable composition according to the embodiment (5), wherein in the metallocene compound (B) comprising a transition metal of Group VIII of the periodic table and aromatic electron system ligands, the transition metal of Group VIII of the periodic table comprises iron, osmium, or ruthenium.

The photocurable composition of the present invention can be rapidly cured by light irradiation even when the gap between a pair of adherends is wide, when the composition applied has overflown from the bonding part, or when the composition applied is not sandwiched between a pair of adherends as in coating. Since the curing reaction proceeds by anionic polymerization, not only the composition does not suffer the surface curing inhibition by oxygen which is observed in radical polymerization, but also even that part of the composition which light cannot reach due to the shape of the substrate cures by the anionic polymerization initiated by light irradiation. Further, since the metallocene compound has a light absorption wavelength region extending beyond 500 nm to the longer-wavelength side, the composition can be cured with a light in a wider wavelength region, i.e., even with ultraviolet and/or visible light.

DETAILED DESCRIPTION OF THE INVENTION

This invention is explained below in detail.

1. α-Cyanoacrylate (A)

Although the α-cyanoacrylate (A) contained as an essential component in the composition of the present invention is not particularly limited, it is represented by general formula (II):

$$H_2C=C(CN)-COOR \qquad (II)$$

(In the formula, R is an ester residue such as, e.g., an alkyl, cycloalkyl, alkenyl, cycloalkenyl, alkynyl, or aryl group. Although the ester residue is not particularly limited in the number of its carbon atoms, it generally has from 1 to 8 carbon atoms. The ester residue may be a substituted hydrocarbon group such as an alkoxyalkyl or trialkylsilylalkyl group.)

Examples of the cyanoacrylate include alkyl and cycloalkyl α-cyanoacrylates such as methyl α-cyanoacrylate, ethyl α-cyanoacrylate, propyl α-cyanoacrylate, butyl α-cyanoacrylate, and cyclohexyl α-cyanoacrylate; alkenyl and cycloalkenyl α-cyanoacrylates such as allyl α-cyanoacrylate, methallyl α-cyanoacrylate, and cyclohexenyl α-cyanoacrylate; alkynyl α-cyanoacrylates such as propargyl α-cyanoacrylate; aryl α-cyanoacrylates such as phenyl α-cyanoacrylate and tolyl α-cyanoacrylate; heteroatom-containing α-cyanoacrylates such as methoxyethyl α-cyanoacrylate, ethoxyethyl α-cyanoacrylate, and furfuryl α-cyanoacrylate; and silicon-containing α-cyanoacrylates such as trimethylsilylmethyl α-cyanoacrylate, trimethylsilylethyl α-cyanoacrylate, trimethylsilylpropyl α-cyanoacrylate, and dimethylvinylsilylmethyl α-cyanoacrylate.

2. Metallocene Compound (B) Comprising Transition Metal of Group VIII of the Periodic Table and Aromatic Electron System Ligands The metallocene compound (B) comprising a transition metal of Group VIII of the periodic table and aromatic electron system ligands, which is another essential component of the composition of the present invention, is not particularly limited in its aromatic electron system ligands. Desirable examples of the ligands include π-arenes, indenyl, and η-cyclopentadienyl. Preferred of these is η-cyclopentadienyl.

Examples of substituents which may be bonded to each ligand include halogen atoms, hydrocarbon groups having 1 to 20 carbon atoms, halogenated hydrocarbon groups having 1 to 20 carbon atoms, and silicon atom-containing, oxygen atom-containing, sulfur atom-containing, and phosphorus atom-containing groups having 1 to 20 carbon atoms. Each ligand may have the same or different substituents, and the substituents may be crosslinked to each other.

Preferred examples of the metallocene compound comprising a transition metal of Group VIII of the periodic table and aromatic electron system ligands are represented by the following structural formula (I):

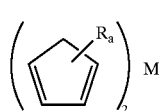

(In the formula, M represents a transition metal of Group VIII of the periodic table. R represents a halogen atom, a hydrocarbon group having 1 to 20 carbon atoms, a halogenated hydrocarbon group having 1 to 20 carbon atoms, or a silicon atom-containing, oxygen atom-containing, sulfur atom-containing, or phosphorus atom-containing group having 1 to 20 carbon atoms, provided that the R's may be the same or different and may be crosslinked to each other. Symbol a represents an integer of from 0 to 5.)

In formula (1), the groups [$R_a$-Cp] (Cp represents η-cyclopentadienyl) may be the same or different.

Specific examples of the metallocene compound comprising a transition metal of Group VIII of the periodic table and aromatic electron system ligands include ferrocene, in which the transition metal is iron, osmocene, in which the transition metal is osmium, ruthenocene in which the transition metal is ruthenium, cobaltocene, in which the transition metal is cobalt, and nickelocene, in which the transition metal is nickel. Among these, ferrocene, osmosene and ruthenocene, and derivatives thereof are preferred.

Examples of ferrocene compounds in which the aromatic electron system ligands are substituted with at least one substituent are shown below and in Examples. In the present invention, metallocene compounds having the structures formed by replacing the iron in these ferrocene compounds with another transition metal of Group VIII of the periodic table, e.g., osmium, ruthenium, cobalt or nickel can also be used. The more substituents the metallocene compounds for use in the present invention have, the better photocurability they tend to have.

(i) Examples of compounds having one or more halogen atom substituents include 4-acetyl-1'-bromo-1,2-diethylferrocene, 1'-bromo-1,2,3-triethylferrocene, 1-acetyl-1'-bromo-2,3-diethylferrocene, 1,1'-dibromo-3-(dibromoboryl)ferrocene, 1,1'-dibromo-3,3'-bis(dibromoboryl)ferrocene, 1-bromo-1'-methylferrocene, 1-bromo-1'-(methoxymethyl)-ferrocene, 1-bromo-1'-(4-methylbenzoyl)ferrocene, 1-iodo-1'-(phenylethyl)ferrocene, 1-iodo-1'-(4-methoxyphenyl)ferrocene, 1-(4-chlorophenyl)-1'-iodoferrocene, 1-iodo-1'-phenylferrocene, 1,3-dichloro-2,4,5'-tris(methylthio)ferrocene, 1,2,4-trichloro-3,5-bis(methylthio)ferrocene, 1,2,3,4-tetrachloro-5-(methylthio)ferrocene, 1-iodo-1'-(3-methoxy-3-oxo-1-propyl)ferrocene, 1,1'-dibromoferrocenium, 2-acetyl-1'-bromo-1,3-diethylferrocene, 1'-bromo-1,2,4-triethylferrocene, 1-acetyl-1'-bromo-2,4-diethylferrocene, 1'-bromo-1,3-diethylferrocene, 1'-bromo-1,2-diethylferrocene, 1-acetyl-1'-bromo-3-ethylferrocene, 1-acetyl-1'-bromo-2-ethylferrocene, 1,1'-dichloroferrocenium, decachloroferrocenium, 1-(3-hydroxy-3-methyl-1-butynyl)-1'-iodoferrocene, 1-chloro-1'-ethynylferrocene, 1-bromo-1'-ethynylferrocene, (acetylcyclopentadienyl)(bromocyclopentadienyl)iron, (bromocyclopentadienyl)(iodocyclopentadienyl)iron, 1-bromo-1'-phenylferrocene, 1-bromo-1'-(triphenylmethyl)ferrocene, 1-bromo-1'-((1-oxooctadecyl)oxy)ferrocene, 1-iodo-1'-((1-oxooctadecyl)oxy)ferrocene, 1-bromo-1'-cuprioferrocene, 1-bromo-1'-pentylferrocene, 1-bromo-1'-(2-methylpropyl)ferrocene, 1-chloro-1'-(3-oxo-3-phenyl-1-propenyl)ferrocene, 1-bromo-1'-formylferrocene, 1-chloro-1'-formylferrocene, 1-bromo-1'-(3-oxo-3-phenyl-1-propenyl)ferrocene, 1-bromo-1'-(2-methyl-1,3-dioxolan-2-yl)ferrocene, 1-bromo-1'-((4-methylphenyl)methyl)ferrocene, 1-bromo-1'-((3-methylphenyl)methyl)ferrocene, 1-bromo-1'-((2-methylphenyl)-methyl)ferrocene, 1-(diphenylphosphino)-1'-iodoferrocene, 1-((3-formylphenyl)ethynyl)-1'-iodoferrocene, 1-((2-formylphenyl)ethynyl)-1'-iodoferrocene, 1,1'-dichloro-2-(trichlorosilyl)ferrocene, (1',2-dichloroferrocenyl)lithium, 1-chloro-1'-phenylferrocene, 1-((4-formylphenyl)ethynyl)-1'-iodoferrocene, 1-(capryoethynyl)-1'-iodoferrocene, decabromoferrocene, formylnonaiodoferrocene, ethylnonaiodoferrocene, nonaiodomethylferrocene, nonabromoformylferrocene, acetylnonaiodoferrocene, 1-(ethoxycarbonyl)-1'-iodoferrocene, 1-bromo-1'-(ethoxycarbonyl)ferrocene, 1-chloro-1'-(ethoxycarbonyl)ferrocene, decaiodoferrocene, 1-benzoyl-1'-bromoferrocene, 1-benzoyl-1'-chloroferrocene, 1,1',2,2',3,3',4,4'-octachloro-5,5'-diiodoferrocene, 1-iodo-1'-methylferrocene, and decachloroferrocene.

(ii) Examples of compounds having one or more hydrocarbon group substituents having 1 to 20 carbon atoms include 1,1'-dimethylferrocene, 1,1'-di-n-butylferrocene, bis(pentamethylcyclopentadienyl)iron, 1,1'-diethylferrocene, 1,1'-dipropylferrocene, 1,1'-di-n-pentylferrocene, 1,1'-di-n-hexylferrocene, 1,1',2-trimethylferrocene, 1,1',2-triethylferrocene, 1,1',2-tripropylferrocene, 1,1',2-tri-n-butylferrocene, 1,1',2-tri-n-pentylferrocene, 1,1',2-tri-n-hexylferrocene, 1,1',3-trimethylferrocene, 1,1',3-triethylferrocene, 1,1',3-tripropylferrocene, 1,1',3-tri-n-butylferrocene, 1,1',3-tri-n-pentylferrocene, 1,1',3-tri-n-hexylferrocene, 1,1',2,2'-tetramethylferrocene, 1,1',2,2'-tetraethylferrocene, 1,1',2,2'-tetrapropylferrocene, 1,1',2,2'-tetra-n-butylferrocene, 1,1',2,2'-tetra-n-pentylferrocene, 1,1',2,2'-tetra-n-hexylferrocene, 1,1',2,3'-tetramethylferrocene, 1,1',2,3'-tetraethylferrocene, 1,1',2,3'-tetrapropylferrocene, 1,1',2,3'-tetra-n-butyl-ferrocene, 1,1',2,3'-tetra-n-pentylferrocene, 1,1',2,3'-tetra-n-hexylferrocene, 1,1',3,3'-tetramethylferrocene, 1,1',3,3'-tetraethylferrocene, 1,1',3,3'-tetrapropylferrocene, 1,1',3,3'-tetra-n-butylferrocene, 1,1',3,3'-tetra-n-pentylferrocene, 1,1',3,3'-tetra-n-hexylferrocene, 1,1',2,3-tetramethylferrocene, 1,1',2,3-tetraethylferrocene, 1,1',2,3-tetrapropylferrocene, 1,1',2,3-tetra-n-butylferrocene, 1,1',2,3-tetra-n-pentylferrocene, 1,1',2,3-tetra-n-hexylferrocene, 1,1',2,4-tetramethylferrocene, 1,1',2,4-tetraethylferrocene, 1,1',2,4-tetrapropylferrocene, 1,1',2,4-tetra-n-butylferrocene, 1,1',2,4-tetra-n-pentylferrocene, 1,1',2,4-tetra-n-hexylferrocene, 1,1',2,2',3-pentamethylferrocene, 1,1',2,2',3-pentaethylferrocene, 1,1',2,2',3-pentapropylferrocene, 1,1',2,2',3-penta-n-butylferrocene, 1,1',2,2',3-penta-n-pentylferrocene, 1,1',2,2',3-penta-n-hexylferrocene, 1,1',2,2',4-pentamethylferrocene, 1,1',2,2',4-pentaethylferrocene, 1,1',2,2',4-pentapropylferrocene, 1,1',2,2',4-penta-n-butylferrocene, 1,1',2,2',4-penta-n-pentylferrocene, 1,1',2,2',4-penta-n-hexylferrocene, 1,1',2,3,3'-pentamethylferrocene, 1,1',2,3,3'-pentaethylferrocene, 1,1',2,3,3'-pentapropylferrocene, 1,1',2,3,3'-penta-n-butylferrocene, 1,1',2,3,3'-penta-n-pentylferrocene, 1,1',2,3,3-penta-n-hexylferrocene, 1,1',2,3',4-pentamethylferrocene, 1,1',2,3',4-pentaethylferrocene, 1,1',2,3',4-pentapropylferrocene, 1,1',2,3',4-penta-n-butylferrocene, 1,1',2,3',4-penta-n-pentylferrocene, 1,1',2,3',4-penta-n-hexylferrocene, 1,1',2,3,4-pentamethylferrocene, 1,1',2,3,4-pentaethylferrocene, 1,1',2,3,4-pentapropylferrocene, 1,1',2,3,4-penta-n-butylferrocene, 1,1',2,3,4-penta-n-pentylferrocene, 1,1',2,3,4-penta-n-hexylferrocene, 1,1',2,3,4,5-hexamethylferrocene, 1,1',2,3,4,5-hexaethylferrocene, 1,1',2,3,4,5-hexapropylferrocene, 1,1',2,3,4,5-hexa-n-butylferrocene, 1,1',2,3,4,5-hexa-n-pentylferrocene, 1,1',2,3,4,5-hexa-n-hexylferrocene, 1,1',2,2',3,4-hexamethylferrocene, 1,1',2,2',3,4-hexaethylferrocene, 1,1',2,2',3,4-hexapropylferrocene, 1,1',2,2',3,4-hexa-n-butylferrocene, 1,1',2,2',3,4-hexa-n-pentylferrocene, 1,1',2,2',3,4-hexa-n-hexylferrocene, 1,1',2,3,3',4-hexamethylferrocene, 1,1',2,3,3',4-hexaethylferrocene, 1,1',2,3,3',4-hexapropylferrocene, 1,1',2,3,3',4-hexa-n-butylferrocene, 1,1',2,3,3',4-hexa-n-pentylferrocene, 1,1',2,3,3',4-hexa-n-hexylferrocene, 1,1',2,2',3,3'-hexamethylferrocene, 1,1',2,2',3,3'-hexaethylferrocene, 1,1',2,2',3,3'-hexapropylferrocene, 1,1',2,2',3,3'-hexa-n-butylferrocene, 1,1',2,2',3,3'-hexa-n-pentylferrocene, 1,1',2,2',3,3'-hexa-n-hexylferrocene, 1,1',2,2',3',4-hexamethylferrocene, 1,1',2,2',3',4-hexaethylferrocene, 1,1',2,2',3',4-hexapropylferrocene, 1,1',2,2',3',4-hexa-n-butylferrocene, 1,1',2,2',3',4-hexa-n-pentylferrocene, 1,1',2,2',3',4-hexa-n-hexylferrocene, 1,1',2,2',4,4'-hexamethylferrocene, 1,1',2,2',4,14'-hexaethylferrocene, 1,1',2,2',4,4'-hexapropylferrocene, 1,1',2,2',4,4'-hexa-n-butylferrocene, 1,1',2,2',4,4'-hexa-n-pentylferrocene, 1,1',2,2',4,4'-hexa-n-hexylferrocene, 1,1',2,2',3,4,5-heptamethylferrocene, 1,1',2,2',3,4,5-heptaethylferrocene, 1,1',2,2',3,4,5-heptapropylferrocene, 1,1',2,2',3,4,5-hepta-n-butylferrocene, 1,1',2,2',3,4,5-hepta-n-pentylferrocene, 1,1', 2,2',3,4,5-hepta-n-hexylferrocene, 1,1',2,3,3',4,5-heptamethylferrocene, 1,1',2,3,3',4,5-heptaethylferrocene, 1,1',2,3,3',4,5-heptapropylferrocene, 1,1',2,3,3',4,5-hepta-n-butylferrocene, 1,1',2,3,3',4,5-hepta-n-pentylferrocene, 1,1',2,3,3',4,5-hepta-n-hexylferrocene, 1,1',2,2',3,3',4-heptamethylferrocene, 1,1',2,2',3,3',4-heptaethylferrocene, 1,1',2,2',3,3',4-heptapropylferrocene, 1,1',2,2',3,3',4-hepta-n-butylferrocene, 1,1',2,2',3,3',4-hepta-n-pentylferrocene, 1,1',2,2',3,3',4-hepta-n-hexylferrocene, 1,1',2,3,3',4,4'-heptamethylferrocene, 1,1',2,3,3',4,4'-heptaethylferrocene, 1,1',2,3,3',4,4'-heptapropylferrocene, 1,1',2,3,3',4,4'-hepta-n-butylferrocene, 1,1',2,3,3',4,4'-hepta-n-pentylferrocene, 1,1',2,3,3',4,4'-hepta-n-hexylferrocene, 1,1',2,2',3,3',4,5-octomethylferrocene, 1,1',2,2',3,3',4,5-octoethylferrocene, 1,1',2,2',3,3',4,5-octopropylferrocene, 1,1',2,2',3,3',4,5-octo-n-butylferrocene, 1,1',2,2',3,3',4,5-octo-n-pentylferrocene, 1,1',2,2',3,3',4,5-octo-n-hexylferrocene, 1,1',2,2',3,4,4',5-octomethylferrocene, 1,1',2,2',3,4,4',5-octoethylferrocene, 1,1',2,2',3,4,4',5-octopropylferrocene, 1,1',2,2',3,4,4',5-octo-n-butylferrocene, 1,1',2,2',3,4,4',5-octo-n-pentylferrocene, 1,1',2,2',3,4,4',5-octo-n-hexylferrocene, 1,1',2,2',3,3',4,4',5-nonamethylferrocene, 1,1',2,2',3,3',4,4',5-nonaethylferrocene, 1,1',2,2',3,3',4,4',5-octopropylferrocene, 1,1',2,2',3,3',4,4',5-octo-n-butylferrocene, 1,1',2,2',3,3',4,4',5-octo-n-pentylferrocene, 1,1',2,2',3,3',4,4',5-octo-n-hexylferrocene, bis(pentaethylcyclopentadienyl)iron, bis(pentapropylcyclopentadienyl)iron, bis(penta-n-butylcyclopentadienyl)iron, bis(penta-n-pentylcyclopentadienyl)iron, bis(penta-n-hexylcyclopentadienyl)iron, 1,1'-dimethyl-2-ethylferrocene, 1,1'-dimethyl-3-ethylferrocene, 1,1'-di-n-butyl-3-methylferrocene, 1,1'-di-n-butyl-3-ethylferrocene, 1,1'-dimethyl-3,3'-diethylferrocene, 1,1',2-trimethyl-3-ethylferrocene, 1,1'-ditriphenylmethylferrocene, 1-methyl-1'-triphenylmethylferrocene, and 1-n-butyl-1'-triphenylmethylferrocene.

(iii) Examples of compounds having one or more halogenated hydrocarbon group substituents having 1 to 20 carbon atoms include 1-methyl-1'-(chloromethyl)ferrocene, 1-chloro-1'-(chloromethyl)ferrocene, 1-methyl-1'-(bromomethyl)ferrocene, 1-methyl-1'-(iodomethyl)ferrocene, 1,1'-di(chloromethyl)ferrocene, 1,1',2-tri(chloromethyl)ferrocene, 11,1',2,2'-tetra(chloromethyl)ferrocene, bis(pentachloromethylcyclopentadienyl)iron, bis(pentabromomethylcyclopentadienyl)iron, 1-methyl-1-(trichloromethyl)ferrocene, 1-ethyl-1'-(trichloromethyl)ferrocene, 1-methyl-1'-(tribromomethyl)ferrocene, 1-methyl-1'-(triiodomethyl)ferrocene, 1-chloro-1'-(trichloromethyl)ferrocene, 1-bromo-1'-(trichloromethyl)ferrocene, 1-bromo-1'-(tribromomethyl)ferrocene, 1,1'-di(trichloromethyl)ferrocene, 1,1'-di(tribromomethyl)ferrocene, 1,1'-di(trichloromethyl)-2-chloroferrocene, 1-acetyl-1'-(trichloromethyl)ferrocene, 1,1'-diacetyl-2-(trichloromethyl)ferrocene, 1,1'-diacetyl-3-(trichloromethyl)ferrocene, 1-formyl-1'-(((chloromethyl)oxy)methyl)ferrocene, 1'-acetyl-1-(((chloromethyl)oxy)methyl)ferrocene, 1-formyl-1'-(((trichloromethyl)oxy)methyl)ferrocene, and 1-acetyl-1-(((trichloromethyl)oxy)methyl)ferrocene.

(iv) Examples of compounds having one or more silicon atom-containing group substituents having 1 to 20 carbon atoms include 1-formyl-1'-(((trimethylsilyl)oxy)methyl)ferrocene, 1-(((6-(((1,1-dimethylethyl)dimethylsilyl)oxy)hexyl)oxy)methyl)-1'-formylferrocene, 1-acetyl-1'-(((trimethylsilyl)oxy)methyl)ferrocene, 1-(((6-(((1,1-dimethylethyl)dimethylsilyl)oxy)hexyl)oxy)methyl)-1'-acetylferrocene, 1,1'-di(((trimethylsilyl)oxy)methyl)ferrocene, 1,1'-di(((6-(((1,1-dimethylethyl)dimethylsilyl)oxy)hexyl)oxy)methyl)ferrocene, 1,1'-di(((trimethylsilyl)oxy)methyl)-2-acetylferrocene, 1,1'-di(((6-(((1,1-dimethylethyl)dimethylsilyl)oxy)hexyl)oxy)methyl)-2-acetylferrocene, 1,1'-di(((trimethylsilyl)oxy)methyl)-2-formylferrocene, 1,1'-di(((6-(((1,1-dimethylethyl)dimethylsilyl)oxy)hexyl)oxy)methyl)-2-formylferrocene, 1-methyl-1'-(((trimethylsilyl)oxy)methyl)ferrocene, 1-(((6-(((1,1-dimethylethyl)dimethylsilyl)oxy)hexyl)oxy)methyl)-1'-methylferrocene, 1-ethyl-1'-(((trimethylsilyl)oxy)methyl)ferrocene, 1-(((6-(((1,1-dimethylethyl)dimethylsilyl)oxy)hexyl)oxy)methyl)-1'-ethylferrocene, 1,1'-di(((trimethylsilyl)oxy)methyl)-2-methylferrocene, 1,1'-di(((6-(((1,1-dimethylethyl)-dimethylsilyl)oxy)hexyl)oxy)methyl)-2-methylferrocene, 1-methyl-1'-(trimethylsilylmethyl)ferrocene, 1-methyl-1'-(trimethylsilylethyl)ferrocene, 1-methyl-1'-(trimethylsilylpropyl)ferrocene, 1,1'-di(trimethylsilylmethyl)ferrocene, 1,1'-di(trimethylsilylethyl)ferrocene, 1,1'-di(dimethylsilylmethyl)ferrocene, 1-acetyl-1'-(trimethylsilylmethyl)ferrocene, 1,1'-diacetyl-2-(trimethylsilylmethyl)ferrocene, and 1,1'-diacetyl-3-(trimethylsilylmethyl)ferrocene.

(v) Examples of compounds having one or more oxygen atom-containing group substituents having 1 to 20 carbon atoms include 1,1'-di(acetylcyclopentadienyl)iron, 1,1'-dibenzoylferrocene, 1,1'-bis(1-oxotetradecyl)ferrocene, 1-(3-ethoxy-1-methyl-3-oxo-1-propenyl)-1'-(1-oxo-3-phenyl-2-propenyl)ferrocene, 1-benzoyl-1'-(3-ethoxy-1-methyl-3-oxo-1-propenyl)ferrocene, 1-(3-ethoxy-1-methyl-3-oxo-1-propenyl)-1'-(phenylacetyl)ferrocene, 1,1'-bis(2-furanylcarbonyl)ferrocene, 1,1'-bis(3-methylbenzoyl)ferrocene, 1-(1,3-dioxopentyl)-1-methylferrocene, (neopentylcyclopentadienyl)(propionylcyclopentadienyl)iron, (pivaloylcyclopentadienyl)(propylcyclopentadienyl)iron, 1-(9-carboxy-1-oxononyl)-1',3-dimethylferrocene, 1-(9-carboxy-1-oxononyl)-1',2-dimethylferrocene, 1-(10-ethoxy-1,10-dioxodecyl)-1',3-dimethylferrocene, 1-(10-ethoxy-1,10-dioxodecyl)-1',2-dimethylferrocene, 1-(6-methoxy-1,6-dioxohexyl)-1'-(1-oxooctadecyl)ferrocene, 1,1'-bis(1-oxononyl)ferrocene, 1-(1-methyl-3-oxo-1-butenyl)-1'-(phenylacetyl)ferrocene, 1-(3-carboxy-1-oxopropyl)-1'-(1-oxoundecyl)ferrocene, 1-(3-carboxy-1-oxopropyl)-1'-(1-oxononyl)ferrocene, 1-(4-ethoxy-1,4-dioxobutyl)-1'-(1-oxoundecyl)ferrocene, 1-(4-ethoxy-1,4-dioxobutyl)-1'-(1-oxononyl)ferrocene, 1,1'-bis(6-carboxy-1-oxohexyl)ferrocene, 1-(5-carboxy-1-oxopentenyl)-1'-(3-carboxy-1-oxopropyl)ferrocene, 1,1'-bis(7-methoxy-1,7-dioxoheptyl)ferrocene, 1-(4-methoxy-1,4-dioxobutyl)-1'-(6-methoxy-1,6-dioxohexyl)ferrocene, bis(o-carboxybenzoylcyclopentadienyl)iron, (cinnamoylcyclopentadienyl)(neopentylcyclopentadienyl)iron, 1,1'-bis(3,5,5-trimethyl-1-oxohexyl)ferrocene; 1,1'-bis(1-oxohexadecyl)ferrocene, (neopentylcyclopentadienyl)(3,5,5-trimethylhexanoylcyclopentadienyl)iron, (neopentylcyclopentadienyl)(pivaloylcyclopentadienyl)iron, ((4-carboxybutyryl)cyclopentadienyl)((3-carboxypropynoyl)cyclopentadienyl)iron, 1,1'-bis(4-carboxy-1-oxobutyl)ferrocene, (isobutylcyclopentadienyl)(pivaloylcyclopentadienyl)iron, (isobutyrylcyclopentadienyl)(neopentylcyclopentadienyl)iron, 1-(5-carboxypentyl)-1'-(1-oxooctadecyl)ferrocene, 1-(5-carboxy-1-oxopentyl)-1'-octadecylferrocene, 1-(5-carboxy-1-oxopentyl)-1'-(1-oxooctadecyl)ferrocene, ((3-carboxypropionyl)cyclopentadienyl)((3-carboxypropyl)cyclopentadienyl)iron, (benzylcyclopentadienyl)

(pivaloylcyclopentadienyl)iron, 1-(9-carboxy-1-oxononyl)-1',2,2',3,3',4,4',5-octamethylferrocene, 1-(10-ethoxy-1,10-dioxodecyl)-1',2,2',3,3',4,4',5-octamethylferrocene, (neopentylcyclopentadienyl)(phenylacetylcyclopentadienyl)iron, (phenethylcyclopentadienyl)(pivaloylcyclopentadienyl)iron, 1,1'-bis(5-methoxy-1,5-dioxopentyl)ferrocene, 1-benzoyl-1'-(1-oxohexadecyl)ferrocene, 1-acetyl-1'-(1-oxohexadecyl)ferrocene, 1,1'-bis(1-oxooctadecyl)ferrocene, 1-acetyl-1'-(1-cyclohexen-1-ylacetyl)ferrocene, 1-acetyl-1'-(1-cycloocten-1-ylacetyl)ferrocene, 1-formyl-1',2,2',3,3',4,4',5-octamethyl-5'-(2,4,6-trimethylbenzoyl)ferrocene, 1-benzoyl-1'-formyl-2,2',3,3',4,4',5,5'-octamethylferrocene, benzoylnonamethylferrocene, 1-(3,3-dimethyl-1-oxobutyl)-1-oxobutyl)-1'-(1-oxo-4-phenylbutyl)ferrocene, 1-(1-oxo-5-(4-(1-oxo-3-phenyl-2-propynyl)phenyl)pentyl)-1'-(1-oxo-3-phenyl-2-propynyl)ferrocene, 1-(1-oxo-4-(4-(1-oxo-3-phenyl-2-propynyl)phenyl)butyl)-1'-(1-oxo-3-phenyl-2-propynyl)ferrocene, 1-(1-oxo-3-phenyl-2-propynyl)phenyl)propyl)-1'-(1-oxo-3-phenyl-2-propynyl)ferrocene, 1-(1-oxo-3-(4-(1-oxo-3-phenyl-2-propenyl)phenyl)propyl)-1'-(1-oxo-3-phenyl-2-propynyl)ferrocene, 1-(1-oxo-3-phenylpropyl)-1'-(1-oxo-3-phenyl-2-propynyl)ferrocene, 1-(phenylacetyl)-1'-(1-oxo-3-phenyl-2-propynyl)ferrocene, 1-(1-oxo-5-phenylpentyl)-1'-(1-oxo-3-phenyl-2-propenyl)ferrocene, 1-(1-oxo-4-phenylbutyl)-1'-(1-oxo-3-phenyl-2-propenyl)ferrocene, 1-(1-oxo-3-phenyl-2-propenyl)-2-propenyl)-1'-(1-oxo-3-phenylpropyl)ferrocene, 1-benzoyl-1'-formylferrocene, 1-benzoyl-1'-(3-oxo-3-phenyl-1-propenyl)ferrocene, 1,1'-bis(1-oxo-2-pentenyl)ferrocene, 1-benzoyl-1'-(1-hydroxy-3-(1-hydroxycyclohexyl)-1-phenyl-2-propynyl)ferrocene, 1,1'-bis(3-carboxy-1-oxopropyl)ferrocene, 1,1'-bis(4-methoxy-1,4-dioxobutyl)ferrocene, 1-acetyl-1'-(1,3-dioxobutyl)-3,3'-dimethylferrocene, 1,1'-bis(1-oxopentyl)ferrocene, ((3-carboxypropionyl)ethylcyclopentadienyl)(ethylcyclopentadienyl)iron, 1,1'-bis(4-(2-methylbutyl)benzoyl)ferrocene, 1,1'-bis(1-oxoundecyl)ferrocene, 1-(4-hydroxyphenyl)-1'-(1-oxo-3-phenyl-2-propenyl)ferrocene, 1-acetyl-1'-(3-(3-methoxyphenyl)-1-oxo-2-propenyl)ferrocene, 1-acetyl-1'-(3-(4-methylphenyl)-1-oxo-2-propenyl)ferrocene, 1-acetyl-1'-(3-(4-methoxyphenyl)-1-oxo-2-propenyl)ferrocene, 1-(3-methyl-1-oxo-2-butenyl)-1'-(phenylacetyl)ferrocene, 1-(4,4-dimethyl-1-oxo-2-pentenyl)-1'-(phenylacetyl)ferrocene, 1-acetyl-1'-(4,4-dimethyl-1-oxo-2-pentenyl)ferrocene, 1-acetyl-1'-(3-methyl-1-oxo-2-butenyl)ferrocene, 1-acetyl-1'-(1-oxo-2-butenyl)ferrocene, 1-acetyl-1'-(2-methyl-1-oxo-2-propenyl)ferrocene, 1-(3,3-dimethyl-1-oxobutyl)-1'-(1-oxo-3-phenyl-2-propenyl)ferrocene, 1-(3-methyl-1-oxobutyl)-1'-(1-oxo-3-phenyl-2-propenyl)ferrocene, 1-(1-oxobutyl)-1'-(1-oxo-3-phenyl-2-propenyl)ferrocene, 1,1'-bis((4-methylphenyl)acetyl)ferrocene, 1,1'-bis(3-(4-methylphenyl)-1-oxo-2-propenyl)ferrocene, 1,1'-bis(3-(2-furanyl)-1-oxo-2-propenyl)ferrocene, 1,1'-bis(hydroxyacetyl)ferrocene, 1-(6-(4-methoxyphenyl)-6-oxohexyl)-1',3-bis(1-oxo-3-phenyl-2-propenyl)ferrocene, 1-(10-(4-methoxyphenyl)-10-oxodecyl)-1',2-bis(1-oxo-3-phenyl-2-propenyl)ferrocene, 1-(5-(4-methoxyphenyl)-5-oxopentyl)-1',3-bis(1-oxo-3-phenyl-2-propenyl)ferrocene, 1-(9-(4-methoxyphenyl)-9-oxononyl)-1',2-bis(1-oxo-3-phenyl-2-propenyl)ferrocene, 1-(8-(4-methoxyphenyl)-8-oxooctyl)-1'-(1-oxo-3-phenyl-2-propenyl)ferrocene, 1,1'-bis(10-ethoxy-1,10-dioxodecyl)ferrocene, 1,1'-bis(9-ethoxy-1,9-dioxononyl)ferrocene, 1,1'-bis(8-ethoxy-1,8-dioxooctyl)ferrocene, 1,1'-bis(7-ethoxy-1,7-dioxoheptyl)ferrocene, 1,1'-bis(5-ethoxy-1,5-dioxopentyl)ferrocene, 1-(1,10-dioxo-10-phenyldecyl)-1'-(1-oxo-3-phenyl-2-propenyl)ferrocene, 1-(1,9-dioxo-9-phenylnonyl)-1'-(1-oxo-3-phenyl-2-propenyl)ferrocene, 1-(1,8-dioxo-8-phenyloctyl)-1'-(1-oxo-3-phenyl-2-propenyl)ferrocene, 1-(1,7-dioxo-7-phenylheptyl)-1'-(1-oxo-3-phenyl-2-propenyl)ferrocene, 1-methyl-1'-(4-methylbenzoyl)ferrocene, 1-(2-methoxy-2-oxoethyl)-1'-(4-methylbenzoyl)ferrocene, 1-benzoyl-1',3-bis(phenylmethyl)ferrocene, 1-benzoyl-1',2-bis(phenylmethyl)ferrocene, 1-benzoyl-1'-(1-hydroxy-1-phenylethyl)ferrocene, 1,1'-bis(1,1'-biphenyl-4-ylcarbonyl)ferrocene, 1-benzoyl-1'-(1-methylcyclopropyl)ferrocene, 1,1'-bis(3-carboxy-1-oxo-2-propenyl)-2-methylferrocene, 1-methyl-1',2-bis(1-oxo-3-phenyl-2-propenyl)ferrocene, 1-(6-methoxy-1,6-dioxohexyl)-1'-((2-oxocyclopentyl)carbonyl)ferrocene, 1,1'-bis(6-ethoxy-1,6-dioxohexyl)ferrocene, 1-(6-ethoxy-1,6-dioxohexyl)-2-((2-oxocyclopentyl)carbonyl)ferrocene, 1,1'-bis(4-methoxybenzoyl)ferrocene, 1,1'-bis(1-oxooctyl)ferrocene, 1-carboxy-1'-(1,2-dioxopropyl)ferrocene, 1-(methoxycarbonyl)-1'-(phenylacetyl)ferrocene, 1-carboxy-1'-(1-oxo-3-phenyl-2-propenyl)ferrocene, 1-carboxy-1'-(oxophenylacetyl)ferrocene, 1-(methoxycarbonyl)-1'-(1-oxo-3-phenyl-2-propenyl)ferrocene, 1-(3-methylphenyl)-1'-(1-oxo-3-phenyl-2-propenyl)ferrocene, 1-(4-methylphenyl)-1'-(1-oxo-3-phenyl-2-propenyl)ferrocene, 1-(1-oxo-3-phenyl-2-propenyl)-1'-phenylferrocene, 1-(3,5-dimethylphenyl)-1'-(1-oxo-3-phenyl-2-propenyl)ferrocene, 1-(3,4-dimethylphenyl)-1'-(1-oxo-3-phenyl-2-propenyl)ferrocene, 1-(4-methoxyphenyl)-1'-(1-oxo-3-phenyl-2-propenyl)ferrocene, 1-(4-(ethoxycarbonyl)phenyl-1'-(1-oxo-3-phenyl-2-propenyl)ferrocene, 1-(3-ethylphenyl)-1'-(1-oxo-3-phenyl-2-propenyl)ferrocene, 1-(4-ethylphenyl)-1'-(1-oxo-3-phenyl-2-propenyl)ferrocene, 1-benzoyl-1'-(methoxymethyl)ferrocene, 1,1'-bis(3-ethoxy-1,3-dioxopropyl)ferrocene, 1-(3,3-dimethyl-1-oxobutyl)-1',3-dimethylferrocene, 1-(3,3-dimethyl-1-oxobutyl)-1',2-dimethylferrocene, 1-acetyl-1'-(2-methyl-1-oxo-3-phenyl-2-propenyl)ferrocene, 1-acetyl-1'-(1-oxo-5-phenyl-2,4-pentadienyl)ferrocene, 1,1'-bis(oxophenylacetyl)ferrocene, 1,1'-bis(phenylacetyl)ferrocene, 1-(3-acetylphenyl)-1'-(1-oxo-3-phenyl-2-propenyl)ferrocene, 1,1'-bis(cyclohexylcarbonyl)ferrocene, 1,1'-bis(1-oxohexyl)ferrocene, 1,1'-bis(3-methyl-1-oxobutyl)ferrocene, 1-(1,1-dimethylethyl)-1'-(2,2-dimethyl-1-oxopropyl)ferrocene, 1-(1,1-dimethylethyl)-1'-(2-methyl-1-oxopropyl)ferrocene, 1-acetyl-1'-(1-oxo-3-phenyl-2-propynyl)ferrocene, 1,1'-bis(2,2-dimethyl-1-oxopropyl)ferrocene,-1-acetyl-1'-(1-oxobutyl)ferrocene, 1-acetyl-1'-(phenylacetyl)-2-(phenylmethyl)ferrocene, 1-benzoyl-1'-(phenylacetyl)ferrocene, 1-(1-oxobutyl)-1'-(phenylacetyl)ferrocene, 1-benzyl-1'-(1-oxobutyl)ferrocene, 1-(1-oxopropyl)-1'-(phenylacetyl)ferrocene, 1-acetyl-1'-(phenylacetyl)ferrocene, 1-benzoyl-1'-(1-oxopropyl)ferrocene, 1-acetyl-3-ethyl-1'-(phenylacetyl)ferrocene, 1-acetyl-1'-(phenylacetyl)-3-(phenylmethyl)ferrocene, 1-(3-ethoxy-1-methyl-3-oxo-1-propenyl)-1'-(1-oxo-2-butenyl)ferrocene, 1-(3-ethoxy-1-methyl-3-oxo-1-propenyl)-1'-(1-oxooctadecyl)ferrocene, 1-(3-ethoxy-1-methyl-3-oxo-1-propenyl)-1'-(1-oxopropyl)ferrocene, 1-acetyl-1'-(3-ethoxy-1-methyl-3-oxo-1-propenyl)ferrocene, 1,1'-bis(((5-((4-methoxyphenoxy)carbonyl)phenoxy)pentyl)oxy)carbonyl)ferrocene, 1,1'-bis((3-(4-((4-methoxyphenoxy)carbonyl)phenoxy)propoxy)carbonyl)ferrocene, 1,1'-bis((2-(4-((4-methoxyphenoxy)carbonyl)phenoxy)ethoxy)carbonyl)ferrocene, 1,1'-bis((heptadecyloxy)carbonyl)ferrocene, 1,1'-bis(((2,3,5,6,8,9,11,12-octahydro-1,4,7,10,13-benzopentaoxacyclopentadecyn-15-yl)oxy)

carbonylferrocene, 1-carboxy-1'-((phenylmethoxy) carbonyl)ferrocene, 1,1'-bis((4-((4-hexyloxy)phenoxy) carbonyl)phenoxy)carbonyl)ferrocene, 1,1'-bis((4-((4-(pentyloxy)phenoxy)carbonyl)phenoxy)carbonyl)ferrocene, 1,1'-bis((4-((4-butoxyphenoxy)carbonyl)phenoxy)carbonyl) ferrocene, 1,1'-bis((4-((4-ethoxyphenoxy)carbonyl) phenoxy)carbonyl)ferrocene, 1,1'-bis((4-((4-(pentyloxy) benzoyl)oxy)phenoxy)carbonyl)ferrocene, 1,1'-bis(4-((4-(butoxybenzoyl)oxy)phenoxy)carbonyl)ferrocene, 1,1'-bis ((4-((4-propoxybenzoyl)oxy)phenoxy)carbonyl)ferrocene, 1,1'-bis((4-((4-ethoxybenzoyl)oxy)phenoxy)carbonyl) ferrocene, 1,1'-bis((4-((4-methoxybenzoyl)oxy)phenoxy) carbonyl)ferrocene, 1-(((1,1'-biphenyl)-4-yloxy)carbonyl)-1'-hexylferrocene, 1-butyl-1'-((4-((4-(pentyloxy)benzoyl) oxy)phenoxy)carbonyl)ferrocene, 1-butyl-1'-((4-hexyloxy) phenoxy)carbonyl)ferrocene, 1-butyl-1'-((4-heptylphenoxy) carbonyl)ferrocene, 1,1'-bis((4-formylphenoxy)carbonyl) ferrocene, 1,1'-bis(((3-formylphenyl)methoxy) carbonylferrocene, 1,1'-bis((4-((4-(hexyloxy)benzoyl)oxy) phenoxy)carbonyl)ferrocene, 1,1'-bis((4-(phenylmethoxy) phenoxy)carbonylferrocene, 1-((4-(decyloxy)phenoxy) carbonyl)-1'-((4-hydroxyphenoxy)carbonyl)ferrocene, 1,1'-bis((4-(decyloxy)phenoxy)carbonyl)ferrocene, 1,1'-bis((4-heptyloxy)phenoxy)carbonyl)ferrocene, 1,1'-bis((4-(1,1-dimethylethyl)phenoxy)carbonylferrocene, 1,1'-bis (methoxycarbonyl)-2,2'-bis(methoxymethyl)ferrocene, 1,1'-bis(methoxycarbonyl)-2,3'-bis(methoxymethyl)ferrocene, 1,1'-bis(ethoxycarbonyl)-2,3'-bis(methoxymethyl) ferrocene, 1,1'-bis(ethoxycarbonyl)-2,2'-bis (methoxymethyl)ferrocene, 1-(ethoxycarbonyl)-1',2-bis (methoxymethyl)ferrocene, 1,1'-bis(((1,4-dihydro-1,4-dioxy-2-naphthalenyl)oxy)carbonyl)ferrocene, 1,1'-bis(((4'-(heptyloxy)(1,1'-biphenyl)-4-yl)oxy)carbonyl)ferrocene, 1,1'-bis(((4'-(hexyloxy)(1,1'-biphenyl)-4-yl)oxy)carbonyl) ferrocene, 1,1'-bis((4'-(pentyloxy)(1,1'-biphenyl)-4-yl)oxy) carbonyl)ferrocene, 1,1'-bis(((4'-butoxy(1,1'-biphenyl)-4-yl) oxy)carbonyl)ferrocene, (methoxycarbonyl) nonamethylferrocene, 1,1'-(methoxycarbonyl)-2,2',3,3',4,4', 5,5'-octamethylferrocene, 1-(2-acetyl-3-oxobutyl)-1'-(methoxycarbonyl)ferrocene, 1-(methoxycarbonyl)-1'-(phenoxymethyl)ferrocene, 1,1'-bis((1,1-dimethylethoxy) carbonyl)ferrocene, 1,1'-bis(((3-hydroxymethyl)phenyl) methoxy)carbonyl)ferrocene, 1,1'-bis(((5-(hydroxymethyl)-2-furanyl)methoxy)carbonyl)ferrocene, 1,1'-bis((4-hydroxyphenoxy)carbonyl)ferrocene, 1-acetyl-1'-(propoxycarbonyl)ferrocene, 1-acetyl-1'-(ethoxycarbonyl) ferrocene, decakis(methoxycarbonyl)ferrocene, 1,1'-bis((2-propenyloxy)carbonyl)ferrocene, 1,1'-bis((phenylmethoxy) carbonyl)ferrocene, 1-(ethoxycarbonyl)-1'-ethylferrocene, 1-(ethoxycarbonyl)-1'-methoxyferrocene, 1-(ethoxycarbonyl)-1'-phenylferrocene, 1-acetyl-1'-(4-(ethoxycarbonyl)phenyl)ferrocene, 1,1-bis ((oxiranylmethoxy)carbonyl)ferrocene, 1-(hydroxymethyl)-1'-(methoxycarbonyl)ferrocene, 1-(methoxycarbonyl)-1',2-diphenylferrocene, 1-(methoxycarbonyl)-1',3-diphenylferrocene, 1,1'-bis(methoxycarbonyl)-3-methylferrocene, 1,2-diformyl-1',2',3,3',4,4',5,5'-octamethylferrocene, 1'-formyl-1,2,3,4-tetramethyl-5-(4,7, 10,13-tetraoxatetradec-1-yl)ferrocene, 1-acetyl-1'-(2-ethoxy-2-oxoethyl)ferrocene, 1-formyl-1'-(((6-hydroxyhexyl)oxy)methyl)ferrocene, 1,1'-diacetyl-3,3'-bis (1'-dimethylethyl)ferrocene, 1 '-formyl-1,2,3,4,5-pentamethylferrocene, 1-(1-methyl-3-oxo-1-butenyl)-1'-(1-oxopropyl)ferrocene, 1-acetyl-1'-(1-methyl-3-oxo-1-butenyl)ferrocene, 1'-formyl-1,2-dimethylferrocene, 1-formyl-1',2,2',3,3',4,4',5-octamethylferrocene, (acetylcyclopentadienyl)(neopentylcyclopentadienyl)iron, 1-acetyl-1'-ethynylferrocene, (benzoylcyclopentadienyl) (neopentylcyclopentadienyl)iron, acetylnonamethylferrocene, 1-formyl-1'-(hydroxyphenylmethyl)-2,2',3,3',4,4',5,5'-octamethylferrocene, 1-formyl-1'-(1-hydroxyethyl)-2,2',3, 3',4,4',5,5'-octamethylferrocene, 1-formyl-3-(hydroxymethyl)-1,1',2,2',3',4,4',5,5'-octamethylferrocene, (acetylcyclopentadienyl)(hydroxycyclopentadienyl)iron, 1'-acetyl-1,2,3,4,5-pentaphenylferrocene, 1,1'-diacetyl-3,3'-dimethylferrocene, (acetylcyclopentadienyl)((2-carboxyvinyl)cyclopentadienyl)iron, (acetylcyclopentadienyl)((2-carboxyethyl) cyclopentadienyl)iron, formylnonamethylferrocene, 1,1'-diformyl-2,2',3,3',4,4',5,5'-octamethylferrocene, 1-formyl-1 -(hydroxymethyl)ferrocene, 1-acetyl-1'-(1-(acetyloxy) ethynyl)ferrocene, 1-acetyl-1'-(8-(4-methoxyphenyl)-8-oxooctyl)ferrocene, 1-acetyl-1',3-bis(phenylmethyl) ferrocene, 1-acetyl-1',2-bis(phenylmethyl)ferrocene, 1-acetyl-1'-(1-hydroxy-1-phenylethyl)ferrocene, 1,1'-diacetyl-2-methylferrocene, 1,1'-diacetyl-3-methylferrocene, 1-formyl-2-(4-methoxyphenyl)ferrocene, 1-(3-ethylphenyl)-1'-formylferrocene, 1-(4-ethylphenyl)-1'-formylferrocene, 1-(3,5-dimethylphenyl )-1'-formylferrocene, 1-(4-(ethoxycarbonyl)phenyl)-1'-formylferrocene, 1-(3,4-dimethylphenyl)-1'-formylferrocene, 1-formyl-1'-(4-methoxyphenyl)ferrocene, 1-formyl-1'-(4-methylphenyl)ferrocene, 1-formyl-1'-(3-methylphenyl)ferrocene, 1-acetyl-1'-(4-(acetyloxy)phenyl) ferrocene, 1-formyl-1'-phenylferrocene, 1-acetyl-1'-(4-methoxyphenyl)ferrocene, 1-acetyl-1'-(3,4-dimethylphenyl) ferrocene, 1-acetyl-1'-(3,5-dimethylphenyl)ferrocene, 1-acetyl-1'-(4-methylphenyl)ferrocene, 1-acetyl-1'-phenylferrocene, 1-acetyl-1'-(3-methylphenyl)ferrocene, 1-acetyl-1'-(2-benzoyl-3-oxo-1-butenyl)ferrocene, 1-acetyl-1'-(3-oxo-5-phenyl-1,4-pentadienyl)ferrocene, 1-acetyl-1'-(2-acetyl-5-oxo-5-phenyl-1,3-pentadienyl)ferrocene, 1-acetyl-1'-(5-oxo-5-phenyl-1,3-pentadienyl)ferrocene, 1-acetyl-1'-(1-hydroxyethyl)ferrocene, 1-acetyl-1'-(1-methoxy-3-phenyl-2-propenyl)ferrocene, 1-acetyl-1',3-bis (1-methylethyl)ferrocene, 1'-acetyl-1,2-dimethylferrocene, 1'-acetyl-1,3-dimethylferrocene, 1-acetyl-1',3-bis(1,1-dimethylethyl)ferrocene, 1-acetyl-1'-(3-methoxy-3-phenyl-1-propenyl)ferrocene, 1-acetyl-1',2-bis(1,1-dimethylethyl) ferrocene, 1-acetyl-1',2-bis(1-methylethyl)ferrocene, 1-acetyl-1',2-diethylferrocene, 1-acetyl-1'-(3-oxobutyl) ferrocene, 1-acetyl-l,-(3-acetylphenyl)ferrocene, 1-acetyl-1'-(4-acetylphenyl)ferrocene, 1-acetyl-1'-methoxyferrocene, 1-acetyl-1'-(tributylstannyl)ferrocene, and 1-formyl-1'-(tributylstannyl)ferrocene.

(vi) Examples of compounds having one or more sulfur-containing group substituents having 1 to 20 carbon atoms include 1-butyl-1'-(4-mercapto-1-oxobutyl)ferrocenium, 1,1'-bis(4-mercapto-1-oxobutyl)ferrocene, 1-(4-mercapto-1-oxobutyl)-1'-(1-oxobutyl)ferrocene, 1-butyl-1'-(4-mercapto-1-oxobutyl)ferrocene, 1-(2-phenylethyl)-1'-(2-thienylcarbonyl)ferrocene, 1-ethyl-3-(1-hydroxyethyl)-1'-(2-thienylcarbonyl)ferrocene, 1-(phenylacetyl)-1'-(2-thienylcarbonyl)ferrocene, 1-benzoyl-1'-(2-thienylcarbonyl) ferrocene, 1-(1-oxopropyl)-1'-(2-thienylcarbonyl)ferrocene, 1,1'-bis((2-((2-((1,3-dithiol-2-ylidene)-1,3-dithiol-4-yl)thio) ethoxy)carbonyl)ferrocene, 1-(methoxycarbonyl)-1'-((phenylthio)methyl)ferrocene, 1,1'-bis((2-(3-thienyl) ethoxy)carbonyl)ferrocene, 1,1'-bis(((5-(hydroxymethyl)-2-thienyl)methoxy)carbonyl)ferrocene, 1-(methoxycarbonyl)-1'-(methoxysulfonyl)ferrocene, 1-acetyl-1'-(5-acetyl-3-phenyl-2-thienyl)ferrocene, cyclopentadiehyl((1-formyl-2-(2-thienyl)vinyl)cyclopentadienyl)iron, 1-formyl-1'- sulfoferrocene, 1-acetyl-1'-(methoxysulfonyl)ferrocene, and 1-acetyl-1'-sulfoferrocene.

(vii) Examples of compounds having one or more phosphorus-containing group substituents having 1 to 20 carbon atoms include 1,1'-bis(diphenylphosphino)ferrocene, 1-acetyl-1'-((diphenylphosphino)acetyl)ferrocene, 1,1'-bis ((diphenylphosphino)acetyl)ferrocene, 1-(diphenylphosphino)-1'-formylferrocene, 1-acetyl-1'-(diphenylphosphino)ferrocene, and 1-acetyl-1'-(diphenylphosphinyl)ferrocene.

(viii) Examples of compounds having substituents crosslinked to each other include 1,1'-diacetyl-2,3'-(1,3-propanediyl)ferrocene, 1,2-diacetyl-1,4'-(1,4-butanediyl) ferrocene, 1,1'-bis(methoxycarbonyl)-2,2'-(oxybis (methylene))ferrocene, 1,1'-bis(ethoxycarbonyl)-2,2'-(oxybis(methylene))ferrocene, 1-benzoyl-1'-(3-oxo-3-phenyl-1-propenyl)-3,3'-(1,3-propanediyl)ferrocene, 1-(phenylacetyl)-1',3-(1,3-propanediyl)ferrocene, 1-((4-methoxyphenyl)acetyl)-1',3-(15-pentanediyl)ferrocenei 1-((4-methoxyphenyl)acetyl)-1',3-(1,3-propanediyl) ferrocene, 1t1'-(1,5-pentanediyl)-3-(phenylacetyl)ferrocene, 1-formyl-1',3-(1,5-pentanediyl)ferrocene, 1,1'-diacetyl-3,3'-(1,5-pentanediyl)ferrocene, 1-benzoyl-1,2-(1,3-cyclopentanediyl)ferrocene, 1',2-(1,4-butanediyl)-1-formyl-21,3-(1,3-propanediyl)ferrocene, 1,1'-diacetyl-2',3-(1,5-pentanediyl)ferrocene, 1-(1-oxo-2-propenyl)-1',3-(1,3-propanediyl)ferrocene, 1-(methoxycarbonyl)-1',2-(1,3-propanediyl)ferrocene, 1-acetyl-1'-(1-oxo-3-phenyl-2-propenyl)-2',3-(1,3-propanediyl)ferrocene, 1-acetyl-1',3-(3-phenyl-1,5-pentanediyl)ferrocene, 1,1'-diacetyl-2,3'-(1,4-butanediyl)ferrocene, 1,1'-diacetyl-3,3'-(1,4-butanediyl) ferrocene, 1,1'-diacetyl-2,3'-(1,4-butanediyl)ferrocene, 1-(methoxycarbonyl)-1',3-(1,3-propanediyl)ferrocene, 1-formyl-1',3-(1,3-propanediyl)ferrocene, 1-formyl-1',2-(1,3-propanediyl)ferrocene, 1'-acetyl-1-(1-oxo-2-propenyl)-2,3'-(1,5-pentanediyl)ferrocene, 1-acetyl-1'-(1-oxo-2-propenyl)-3,3-(1,5-pentanediyl)ferrocene, 1-benzoyl-1'-(3-oxo-3-phenyl-1-propenyl)-3,3'-(1,5-pentanediyl)ferrocene, 1-benzoyl-1'-formyl-3,3'-(1,5-pentanediyl)ferrocene, 1-benzoyl-1'-formyl-3,3'-(1,3-propanediyl)ferrocene, 1,1'-bis(methoxycarbonyl)-2,2',3,3'-bis(1,3-propanediyl) ferrocene, 1,1'-bis(methoxycarbonyl)-2,2':4,4-bis(1,3-propanediyl)ferrocene, 1,1'-bis(methoxycarbonyl)-2,4':2',4-bis(1,3-propanediyl)ferrocene, 1-(methoxycarbonyl)-1',2:3',4-bis(1,3-propanediyl)ferrocene, 1,4-bis(methoxycarbonyl)-1',2:2',3-bis(1,3-propanediyl)ferrocene, 1-(methoxycarbonyl)-1',2:2',3-bis(1,3-propanediyl) ferrocene, 1',2-(1,4-butanediyl)-1-(4-methoxy-1,4-dioxobutyl)-2',3-(1-oxo-1,3-propanediyl)ferrocene, 1,1'-bis (methoxycarbonyl)-2,3'-(1,3-propanediyl)ferrocene, 1,1'-bis (methoxycarbonyl)-3,3 -(1,3-propanediyl)ferrocene, 1-(methoxycarbonyl)-1',3-(1,3-propanediyl)ferrocene, 1,1'-bis(methoxycarbonyl)-2,2'-(1,3-propanediyl)ferrocene, 1-formyl-1',2-(1,5-pentanediyl)ferrocene, 1-acetyl-1'-(1-oxo-3-phenyl-2-propenyl)-3,3'-(1,5-pentanediyl)ferrocene, 1,1'-bis(1-oxo-3-phenyl-2-propenyl)-3,3'-(1,5-pentanediyl) ferrocene, 1-formyl-1',2:3',4-bis(pentanediyl)ferrocene, 1-acetyl-1',2-(1,3-cyclopentanediyl)ferrocene, 1,1'-diacetyl-3,3'-(1,5-pentanediyl)ferrocene, 1,2-diacetyl-1',4-(1,3-propanediyl)ferrocene, 1,1'-diacetyl-3,3'-(1,3-propanediyl) ferrocene, 1,1'-diacetyl-2,2'-(1,3-propanediyl)ferrocene, 1,4-diacetyl-1',2-(1,3-propanediyl)ferrocene, 1-(1-oxo-3-phenyl-2-propenyl)-1,2'-(1,3-propanediyl)ferrocene, 1,1'-bis(1-oxo-3-phenyl-2-propenyl)-3,3'-(1,3-propanediyl) ferrocene, 1,1'-bis(1-oxo-3-phenyl-2-propenyl)-2,3'-(1,3-propanediyl)ferrocene, 1-(1-oxo-3-phenyl-2-propenyl)-1',3-(1,3-propanediyl)ferrocene, 1-acetyl-1'-(1-oxo-3-phenyl-2-propenyl)-3,3'-(1,3-propanediyl)ferrocene, 1-acetyl-1'-(1-oxo-3-phenyl-2-propenyl)-2,2'-(1,3-propanediyl)ferrocene, 1-acetyl-1'-(1-oxo-3-phenyl-2-propenyl)-2,3'-(1,3-propanediyl)ferrocene, 1,1'-diacetyl-3,3'-(1,3-propanediyl) ferrocene, 1,1'-diacetyl-2,2'-(1,3-propanediyl)ferrocene, 1,1'-diacetyl-2,3'-(1,3-propanediyl)ferrocene, 1-acetyl-1',2-(1,3-propanediyl)ferrocene, 1-benzoyl-1',3-(1,3-propanediyl)ferrocene, 1-benzoyl-1',2-(1,3-propanediyl) ferrocene, 1-(1-oxopropyl)-1',3-(1,3-propanediyl)ferrocene, 1-(1-oxopropyl)-1',2-(1,3-propanediyl)ferrocene, 1-acetyl-1',3-(1,3-propanediyl)ferrocene, 1-acetyl-1',3-(4-oxo-1,4-butanediyl)ferrocene, 1-acetyl-1',2-(4-oxo-1,4-butanediyl) ferrocene, 1-acetyl-1',2-(1-oxo-1,4-butanediyl)ferrocene, 1-acetyl-1',3-(5-oxo-1,5-pentanediyl) ferrocene, 1-acetyl-1', 2-(5-oxo-1,5-pentanediyl)ferrocene, 1-acetyl-1',3-(3-oxo-1, 3-propanediyl)ferrocene, 1-acetyl-1',3-(1-oxo-1,3-propanediyl)ferrocene, 1-acetyl-1',2-(3-oxo-1,3-propanediyl)ferrocene, 1-acetyl-1',2-(1-oxo-1,3-propanediyl)ferrocene, 1-acetyl-1',2:3',4-bis(1,3-propanediyl)ferrocene, 1-acetyl-1',3-(1,5-pentanediyl) ferrocene, 1-acetyl-1',2-(1,5-pentanediyl)ferrocene, 1-acetyl-1',3-(1,4-butanediyl)ferrocene, 1-acetyl-1',2-(1,4-butanediyl)ferrocene, 1-formyl-1',3-(1,3-propanediyl) ferrocene, 1-formyl-1',2-(1,3-propanediyl)ferrocene, 1-(4-methoxy-1,4-dioxobutyl)-1',2-(1,3-propanediyl)ferrocene, 1-(4-methoxy-1,4-dioxobutyl)-1',3- (1,3-propanediyl) ferrocene, 1-(3-carboxy-1-oxopropyl)-1',2-(1,3-propanediyl)ferrocene, 1-(3-carboxy-1-oxopropyl)-1',3-(1, 3-propanediyl)ferrocene, 1-iodo-1',2:3',4-bis(1,3-propanediyl)ferrocene, 1-iodo-1',3-(1,5-pentanediyl) ferrocene, 1,1'-dibromo-2,2':3,3':5,5'-tris(1,3-propanediyl) ferrocene, 1,1'-dichloro-2,2'-(diphenylsilylene)ferrocene, 1,1'-dichloro-2,2'-(dichlorosilylene)ferrocene, 1,1'-diiodo-2, 3'-(1,3-propanediyl)ferrocene, 1,1'-dibromo-2,3'-(1,3-propanediyl)ferrocene, 1,1'-diiodo-3,3'-(1,3-propanediyl) ferrocene, 1,1'-dibromo-3,3'-(1,3-propanediyl)ferrocene, 1-iodo-1',3-(1,3-propanediyl)ferrocene, 1-bromo-1',3-(1,3-propanediyl)ferrocene, 1,1'-diiodo-2,2'-(1,3-propanediyl) ferrocene, 1,1'-dibromo-2,2'-(1,3-propanediyl)ferrocene, 1-iodo-1 ,2-(1,3-propanediyl)ferrocene, 1-bromo-1',2-(1,3-propanediyl)ferrocene, 1-chloro-1',3-(1,5-dioxo-3-phenyl-1, 5-pentanediyl)ferrocene, 1-bromo-1 ,3-(1,5-dioxo-3-phenyl-1,5-pentanediyl)ferrocene, and 1-bromo-1',3-(3-carboxy-1,5-dioxo-1,5-pentanediyl)ferrocene.

3. Cleavage-type Photoinitiator (C)

The cleavage-type photoinitiator (accelerator) (C) for use in the present invention is not particularly limited. Examples of the cleavage-type photoinitiator are given in Examples and below. Namely, examples thereof include (i) acetophenone photoinitiators such as 4-phenoxydichloroacetophenone, 4-t-butyldichloroacetophenone, 4-t-butyltrichloroacetophenone, diethoxyacetophenone, 2-hydroxy-2-methyl-1-phenylpropan-1-one, 1-(4-isopropylphenyl)-2-hydroxy-2-methylpropan-1-one, 1-(4-dodecylphenyl)-2-hydroxy-2-methylpropan-1-one, 4-(2-hydroxyethoxy)phenyl (2-hydroxy-2-propyl) ketone, 1-hydroxycyclohexyl phenyl ketone, and 2-methyl-1-(4-(methylthio)phenyl)-2-morpholinopropane-1; (ii) benzoin photoinitiators such as benzoin, benzoin methyl ethers benzoin ethyl ether, benzoin isopropyl ether, benzoin isobutyl ether, and benzoin methyl ketal; and (iii) other photoinitiators including α-acyloxime esters, acylphosphine oxides, methylphenyl glyoxylate, 3,3',4,4'-tetra(t-butylperoxycarbonyl)benzophenone, and 2,2'-azobis(2-methylbutyronitrile).

In the case where the cleavage-type photoinitiator used is a peroxide, heating can also be used to cure the composition. In the case where the cleavage-type photoinitiator used is an azo compound, the composition can be foamed by regulating the addition amount of the photoinitiator or the quantity of light with which the composition is irradiated.

The photocurable composition of the present invention is prepared by mixing and stirring the α-cyanoacrylate (A), the metallocene compound (B) comprising a transition metal of Group VIII of the periodic table and aromatic electron system ligands, and the cleavage-type photoinitiator (C) to completely dissolve the components (B) and (C) in the component (A). In the case where heating and stirring are required to dissolve the component (C), heating and stirring are conducted at a temperature such that the component (A) is not degraded in quality or decomposed (generally up to about 60° C.). The component (B) is dissolved in a similar manner as in the component (C). In general, the component (B) can be dissolved in the component (A) so that it is necessary to heat and stir the component (B).

During and after adding the component (B) and (C), especially the component (C), to the component (A), the reaction system must be maintained to be shaded.

The component (C) is added to the component (B) in limited amounts while stirring, so as not to add all the component (C) at a time.

The above components each may be a single compound or a mixture of two or more compounds.

The addition amount of the component (B), which varies widely depending on kinds of the component (B), is 10 to 100,000 ppm by weight, preferably 30 to 50,000 ppm by weight, more preferably 50 to 10,000 ppm based on the weight of the component (A).

The addition amount of the component (C), which varies widely depending on kinds and addition amount of the component (B) and kinds of the component (C), is 100 to 20,000 ppm by weight, preferably 300 to 15,000 ppm by weight, more preferably 500 to 10,000 ppm based on the weight of the component (A).

The addition amount of the component (B) can be reduced by adding the component (C) to the component (A).

In the case where the respective components are a mixture comprising two or more ingredients, the total amount of the ingredients of each component is the above addition amount.

The composition may further contain one or more of the following ingredients as long as the effect of the present invention is not impaired.
(1) anionic-polymerization inhibitors
(2) radical-polymerization inhibitors
(3) thickening agents
(4) specific additives such as curing accelerators, plasticizers, tougheners, and heat stabilizers
(5) perfumes, dyes, pigments, etc.

A radical-polymerizable compound such as an acrylic ester, can be added to the photocurable composition of the present invention. Even if a radical-polymerizable compound is added, the photocurable composition of the present invention can be rapidly cured owing to the cleavage-type photoinitiator.

An anionic-polymerization inhibitor may be added in order to enhance the storage stability of the composition. Known examples thereof include sulfur dioxide, sulfur trioxide, nitrogen oxide, hydrogen fluoride, and p-toluenesulfonic acid. The anionic-polymerization inhibitor may be added in an amount of 0.1 to 10,000 ppm by weight based on the weight of the component (A).

Examples of radical-polymerization inhibitors include quinone, hydroquinone, t-butylcatechol, and p-methoxyphenol. The radical-polymerization inhibitor may be added in an amount of 0.1 to 10,000 ppm by weight based on the weight of the component (A).

A thickening agents may be added in order to heighten the viscosity of the composition. Examples thereof include polymethacrylates (including poly(methyl methacrylate)), methacrylate copolymers, acrylic rubbers, cellulose derivatives, poly(vinyl acetate), and poly(α-cyanoacrylate)s.

Many kinds of polymeric additives may be added usually for toughening. Examples thereof include acrylic elastomers, acrylonitrile copolymer elastomers, fluoroelastomers, and a fine silica filler. These substances function also as thickening agents. Other additives known to artisans may be used in the present invention.

The curing of the photocurable composition of the present invention includes two kinds of curing, i.e., curing by anionic polymerization caused by a minute amount of the adsorption water present on adherend surface and curing by anionic photopolymerization caused by light irradiation using a metallocene compound.

The method for curing the photocurable composition of the present invention using light irradiation comprises coating an adherends with the photocurable composition and irradiating the composition with electron beam, ultraviolet light, visible light or near infrared light using a high pressure mercury lamp, a halogen lamp, a xenon lamp or sunlight. Effective wavelength of the irradiated light varies with kinds of the metallocene compound and cleavage-type photoinitiator. Ultraviolet light and visible light are preferred.

The photocurable composition of the present invention may be applied to various known uses as well as, in particular, to sealing of electronic parts, to furnishing a reel seat or fishing-line guides on a fishing rod, to fixing wires such as a coil, to filling for use in dental remedy, and to bonding or decorating an artificial nail.

The present invention will be explained below by reference to Examples and Comparative Examples, but the invention should not be construed as being limited to these Examples.

For the evaluation of photocurability, a 4-kW high-pressure mercury lamp (manufactured by ORC Manufacturing Co.; Ltd. was used as an ultraviolet irradiator to irradiate each sample from a distance of 15 cm. The values of integrated quantity of light shown in the Examples and Comparative Examples were found values obtained with integrating actinometer UV-350 (manufactured by Oak Manufacturing Co., Ltd.).

The results of a photocurability test shown in the Examples and Comparative Examples are given in terms of the integral of the quantity of light needed for complete photocuring; an irradiation operation in which the integrated quantity of light was regulated to 1,000 mJ/cm$^2$ was repeated until complete photocuring.

In the Examples and Comparative Examples, THREE BOND 1741 (ethyl α-cyanoacrylate adhesive; hereinafter abbreviated as TB1741) was used as an α-cyanoacrylate unless otherwise indicated.

The cleavage-type (hereinafter referred to as P1 type) photoinitiators used in the Examples and Comparative Examples were an acylphosphine oxide,(hereinafter abbreviated as APO), IRGACURE 184 (CAS No. 947-19-3) (1-hydroxycyclohexyl phenyl ketone manufactured by Ciba-Geigy Ltd.) IRGACURE 651 (CAS No. 24650-42-8) (benzyl dimethyl ketal manufactured by Ciba-Geigy Ltd.), VICURE 55 (CAS No. 15206-33-0) (methylphenyl glyoxylate manufactured by Stauffer Chemical Company), BTTB (3,3',4,4'-tetra(t-butylperoxycarbonyl)benzophenone manufactured by Nippon Oil & Fats Co., Ltd.), and V-59 (2,2'-azobis(2-methylbutyronitrile) manufactured by Wako Pure Chemical Industries, Ltd.).

EXAMPLES 1 TO 11

In Examples 1 to 5, ferrocene (hereinafter referred to as $Cp_2Fe$) as a metallocene compound alone was added to TB1741 in predetermined amounts to obtain photocurable cyanoacrylate compositions.

In Examples 6 to 11, $Cp_2Fe$ as a metallocene compound and various P1 type photoinitiators were added to TB1741 in predetermined amounts to obtain photocurable cyanoacrylate compositions.

COMPARATIVE EXAMPLES 1 TO 13

In Comparative Example 1, TB1741 alone was irradiated with light to ascertain as to whether a cured resin was not obtained.

In Comparative Examples 2 to 7, various P1 type photoinitiators alone were added to TB1741 in predetermined amounts to obtain cyanoacrylate compositions.

In Comparative Examples 8 to 10, various hydrogen-abstracting (hereinafter referred to as P2 type) photoinitiators alone were added to TB1741 in predetermined amounts to obtain cyanoacrylate compositions.

In Comparative Examples 11 to 13, $Cp_2Fe$ and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 1 to 11 and Comparative Examples 1 to 13 are shown in Table 1.

TABLE 1

| | Photoinitiator | Addition Amount | Amount of $Cp_2Fe$ | Photo-curability (mJ/cm$^2$) |
|---|---|---|---|---|
| Ex. 1 | — | — | 1,000 ppm | 20,000 |
| Ex. 2 | — | — | 5,000 ppm | 15,000 |
| Ex. 3 | — | — | 10,000 ppm | 12,000 |
| Ex. 4 | — | — | 30,000 ppm | 5,000 |
| Ex. 5 | — | — | 50,000 ppm | 2,000 |
| | | P1 type | | |
| Ex. 6 | APO | 1,000 ppm | 5,000 ppm | 1,000 |
| Ex. 7 | Irgacure 184 | 10,000 ppm | 5,000 ppm | 2,000 |
| Ex. 8 | Irgacure 651 | 10,000 ppm | 5,000 ppm | 9,000 |
| Ex. 9 | Vicure 55 | 5,000 ppm | 1,000 ppm | 7,000 |
| Ex. 10 | BTTB | 5,000 ppm | 1,000 ppm | 3,000 |
| Ex. 11 | V-59 | 5,000 ppm | 1,000 ppm | 6,000 |
| Comp. Ex. 1 | — | — | — | 20,000< |
| | | P1 type | | |
| Comp. Ex. 2 | APO | 1,000 ppm | — | 20,000< |
| Comp. Ex. 3 | Irgacure 184 | 10,000 ppm | — | 20,000< |
| Comp. Ex. 4 | Irgacure 651 | 10,000 ppm | — | 20,000< |
| Comp. Ex. 5 | Vicure 55 | 5,000 ppm | — | 20,000< |
| Comp. Ex. 6 | BTTB | 5,000 ppm | — | 20,000< |

TABLE 1-continued

| | Photoinitiator | Addition Amount | Amount of $Cp_2Fe$ | Photo-curability (mJ/cm$^2$) |
|---|---|---|---|---|
| Comp. Ex. 7 | V-59 | 5,000 ppm | — | 20,000< |
| | | P2 type | | |
| Comp. Ex. 8 | benzophenone | 5,000 ppm | — | 20,000< |
| Comp. Ex. 9 | benzanthrone | 1,000 ppm | — | 20,000< |
| Comp. Ex. 10 | phenanthrene-quinone | 1,000 ppm | — | 20,000< |
| Comp. Ex. 11 | benzophenone | 5,000 ppm | 5,000 ppm | 15,000 |
| Comp. Ex. 12 | benzanthrone | 1,000 ppm | 5,000 ppm | 20,000< |
| Comp. Ex. 13 | phenanthrene-quinone | 1,000 ppm | 5,000 ppm | 16,000 |

*20,000< in photocurability evaluation means that the sample remained uncured after irradiation in an integrated quantity of light of 20,000 mJ/cm$^2$.

EXAMPLES 12 TO 20

In Examples 12 to 14, ethylferrocene (hereinafter referred to as (EtCp)CpFe) as a metallocene compound alone was added to TB1741 in predetermined amounts to obtain photocurable cyanoacrylate compositions.

In Examples 15 to 20, (EtCp)CpFe as a metallocene compound and various P1 type photoinitiators were added to TB1741 in predetermined amounts to obtain photocurable cyanoacrylate compositions.

COMPARATIVE EXAMPLES 14 TO 16

In Comparative Examples 14 to 16, (EtCp)CpFe and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 12 to 20 and Comparative Examples 14 to 16 are shown in Table 2.

TABLE 2

| | Photoinitiator | Addition Amount | Amount of (EtCp)CpFe | Photo-curability (mJ/cm$^2$) |
|---|---|---|---|---|
| Ex. 12 | — | — | 1,000 ppm | 8,000 |
| Ex. 13 | — | — | 5,000 ppm | 6,000 |
| Ex. 14 | — | — | 10,000 ppm | 5,000 |
| | | P1 type | | |
| Ex. 15 | APO | 1,000 ppm | 5,000 ppm | 1,000 |
| Ex. 16 | Irgacure 184 | 10,000 ppm | 5,000 ppm | 2,000 |
| Ex. 17 | Irgacure 651 | 10,000 ppm | 5,000 ppm | 2,000 |
| Ex. 18 | Vicure 55 | 5,000 ppm | 1,000 ppm | 3,000 |
| Ex. 19 | BTTB | 5,000 ppm | 1,000 ppm | 2,000 |
| Ex. 20 | V-59 | 5,000 ppm | 1,000 ppm | 3,000 |
| | | P2 type | | |
| Comp. Ex. 14 | benzophenone | 5,000 ppm | 5,000 ppm | 6,000 |
| Comp. Ex. 15 | benzanthrone | 1,000 ppm | 5,000 ppm | 7,000 |

TABLE 2-continued

| | Photoinitiator | Addition Amount | Amount of (EtCp)CpFe | Photo-curability (mJ/cm$^2$) |
|---|---|---|---|---|
| Comp. Ex. 16 | phenanthrene-quinone | 1,000 ppm | 5,000 ppm | 16,000 |

EXAMPLES 21 TO 26

In Examples 21 to 22, n-butylferrocene (hereinafter referred to as (BuCp)CpFe) as a metallocene compound alone was added to TB1741 in a predetermined amount to obtain a photocurable cyanoacrylate composition.

In Examples 23 to 26, (BuCp)CpFe as a metallocene compound and various P1 type photoinitiators were added to TB1741 in predetermined amounts to obtain photocurable cyanoacrylate compositions.

COMPARATIVE EXAMPLES 17 TO 19

In Comparative Examples 17 to 19, (BuCp)CpFe as a metallocene compound and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 21 to 26 and Comparative Examples 17 to 19 are shown in Table 3.

TABLE 3

| | Photoinitiator | Addition Amount | Amount of (BuCp)CpFe | Photo-curability (mJ/cm$^2$) |
|---|---|---|---|---|
| Ex. 21 | — | — | 5,000 ppm | 5,000 |
| Ex. 22 | — | — | 10,000 ppm | 4,000 |
| | P1 type | | | |
| Ex. 23 | APO | 1,000 ppm | 5,000 ppm | 1,000 |
| Ex. 24 | Irgacure 184 | 10,000 ppm | 5,000 ppm | 2,000 |
| Ex. 25 | Irgacure 651 | 10,000 ppm | 5,000 ppm | 4,000 |
| Ex. 26 | Vicure 55 | 5,000 ppm | 1,000 ppm | 3,000 |
| | P2 type | | | |
| Comp. Ex. 17 | benzophenone | 5,000 ppm | 5,000 ppm | 6,000 |
| Comp. Ex. 18 | benzanthrone | 1,000 ppm | 5,000 ppm | 12,000 |
| Comp. Ex. 19 | phenanthrene-quinone | 1,000 ppm | 5,000 ppm | 10,000 |

EXAMPLES 27 TO 31

In Example 27, tert-amylferrocene (hereinafter referred to as (AmCp)CpFe) as a metallocene compound alone was added to TB1741 in a predetermined amount to obtain a photocurable cyanoacrylate composition.

In Examples 28 to 31, (AmCp)CpFe as a metallocene compound and various P1 type photoinitiators were added to TB1741 in predetermined amounts to obtain photocurable cyanoacrylate compositions.

COMPARATIVE EXAMPLES 20 TO 22

In Comparative Examples 20 to 22, (AmCp)CpFe as a metallocene compound and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 27 to 31 and Comparative Examples 20 to 22 are shown in Table 4.

TABLE 4

| | Photoinitiator | Addition Amount | Amount of (AmCp)CpFe | Photo-curability (mJ/cm$^2$) |
|---|---|---|---|---|
| Ex. 27 | — | — | 5,000 ppm | 7,000 |
| | P1 type | | | |
| Ex. 28 | APO | 1,000 ppm | 5,000 ppm | 1,000 |
| Ex. 29 | Irgacure 184 | 10,000 ppm | 5,000 ppm | 3,000 |
| Ex. 30 | Irgacure 651 | 10,000 ppm | 5,000 ppm | 4,000 |
| Ex. 31 | Vicure 55 | 5,000 ppm | 1,000 ppm | 5,000 |
| | P2 type | | | |
| Comp. Ex. 20 | benzophenone | 5,000 ppm | 5,000 ppm | 7,000 |
| Comp. Ex. 21 | benzanthrone | 1,000 ppm | 5,000 ppm | 11,000 |
| Comp. Ex. 22 | phenanthrene-quinone | 1,000 ppm | 5,000 ppm | 8,000 |

EXAMPLES 32 TO 37

In Example 32 to 33, benzoylferrocene (hereinafter referred to as (BzoCp)CpFe) as a metallocene compound alone was added to TB1741 in a predetermined amount to obtain a photocurable cyanoacrylate composition.

In Examples 34 to 37, (BzoCp)CpFe as a metallocene compound and various P1 type photoinitiators were added to TB1741 in predetermined amounts to obtain photocurable cyanoacrylate compositions.

COMPARATIVE EXAMPLES 23 TO 25

In Comparative Examples 23 to 25, (BzoCp)CpFe as a metallocene compound and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 32 to 37 and Comparative Examples 23 to 25 are shown in Table 5.

TABLE 5

| | Photoinitiator | Addition Amount | Amount of (BzoCp)CpFe | Photo-curability (mJ/cm$^2$) |
|---|---|---|---|---|
| Ex. 32 | — | — | 5,000 ppm | 15,000 |
| Ex. 33 | — | — | 10,000 ppm | 12,000 |
| | P1 type | | | |
| Ex. 34 | APO | 1,000 ppm | 5,000 ppm | 9,000 |
| Ex. 35 | Irgacure 184 | 10,000 ppm | 5,000 ppm | 9,000 |
| Ex. 36 | Irgacure 651 | 10,000 ppm | 5,000 ppm | 10,000 |
| Ex. 37 | Vicure 55 | 5,000 ppm | 1,000 ppm | 6,000 |

TABLE 5-continued

|  | Photoinitiator | Addition Amount | Amount of (BzoCp)CpFe | Photo-curability (mJ/cm$^2$) |
|---|---|---|---|---|
| | | P2 type | | |
| Comp. Ex. 23 | benzophenone | 5,000 ppm | 5,000 ppm | 18,000 |
| Comp. Ex. 24 | benzanthrone | 1,000 ppm | 5,000 ppm | 16,000 |
| Comp. Ex. 25 | phenanthrene-quinone | 1,000 ppm | 5,000 ppm | 17,000 |

EXAMPLES 38 TO 42

In Example 38, cyclohexenylferrocene (hereinafter referred to as (CyheCp)CpFe) as a metallocene compound alone was added to TB1741 in a predetermined amount to obtain a photocurable cyanoacrylate composition.

In Examples 39 to 42, (CyheCp)CpFe as a metallocene compound and various P1 type photoinitiators were added to TB1741 in predetermined amounts to obtain photocurable cyanoacrylate compositions.

COMPARATIVE EXAMPLES 26 TO 28

In Comparative Examples 26 to 28, (CyheCp)CpFe as a metallocene compound and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 38 to 42 and Comparative Examples 26 to 28 are shown in Table 6.

TABLE 6

|  | Photoinitiator | Addition Amount | Amount of (CyheCp)CpFe | Photo-curability (mJ/cm$^2$) |
|---|---|---|---|---|
| Ex. 38 | — | — | 5,000 ppm | 9,000 |
| | | P1 type | | |
| Ex. 39 | APO | 1,000 ppm | 5,000 ppm | 2,000 |
| Ex. 40 | Irgacure 184 | 10,000 ppm | 5,000 ppm | 4,000 |
| Ex. 41 | Irgacure 651 | 10,000 ppm | 5,000 ppm | 4,000 |
| Ex. 42 | Vicure 55 | 5,000 ppm | 1,000 ppm | 8,000 |
| | | P2 type | | |
| Comp. Ex. 26 | benzophenone | 5,000 ppm | 5,000 ppm | 10,000 |
| Comp. Ex. 27 | benzanthrone | 1,000 ppm | 5,000 ppm | 11,000 |
| Comp. Ex. 28 | phenanthrene-quinone | 1,000 ppm | 5,000 ppm | 11,000 |

EXAMPLES 43 TO 47

In Example 43, cyclopentenylferrocene (hereinafter referred to as (CypeCp)CpFe) as a metallocene compound alone was added to TB1741 in a predetermined amount to obtain a photocurable cyanoacrylate composition.

In Examples 44 to 47, (CypeCp)CpFe as a metallocene compound and various P1 type photoinitiators were added to TB1741 in predetermined amounts to obtain photocurable cyanoacrylate compositions.

COMPARATIVE EXAMPLES 29 TO 31

In Comparative Examples 29 to 31, (CypeCp)CpFe as a metallocene compound and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 43 to 47 and Comparative Examples 29 to 31 are shown in Table 7.

TABLE 7

|  | Photoinitiator | Addition Amount | Amount of (CypeCp)CpFe | Photo-curability (mJ/cm$^2$) |
|---|---|---|---|---|
| Ex. 43 | — | — | 5,000 ppm | 13,000 |
| | | P1 type | | |
| Ex. 44 | APO | 1,000 ppm | 5,000 ppm | 3,000 |
| Ex. 45 | Irgacure 184 | 10,000 ppm | 5,000 ppm | 4,000 |
| Ex. 46 | Irgacure 651 | 10,000 ppm | 5,000 ppm | 5,000 |
| Ex. 47 | Vicure 55 | 5,000 ppm | 1,000 ppm | 11,000 |
| | | P2 type | | |
| Comp. Ex. 29 | benzophenone | 5,000 ppm | 5,000 ppm | 14,000 |
| Comp. Ex. 30 | benzanthrone | 1,000 ppm | 5,000 ppm | 13,000 |
| Comp. Ex. 31 | phenanthrene-quinone | 1,000 ppm | 5,000 ppm | 13,000 |

EXAMPLES 48 TO 53

In Example 48 to 49, ferrocenecarboxyaldehyde (hereinafter referred to as (CaAlCp)CpFe) as a metallocene compound alone was added to TB1741 in a predetermined amount to obtain a photocurable cyanoacrylate composition.

In Examples 50 to 53, (CaAlCp)CpFe as a metallocene compound and various P1 type photoinitiators were added to TB1741 in predetermined amounts to obtain photocurable cyanoacrylate compositions.

COMPARATIVE EXAMPLES 32 TO 34

In Comparative Examples 32 to 34, (CaAlCp)CpFe as a metallocene compound and various P2 type photoinitiators were added to TB1741 in predetermined amounts to obtain cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 48 to 53 and Comparative Examples 32 to 34 are shown in Table 8.

TABLE 8

|  | Photoinitiator | Addition Amount | Amount of (CaAlCp)CpFe | Photo-curability (mJ/cm$^2$) |
|---|---|---|---|---|
| Ex. 48 | — | — | 5,000 ppm | 12,000 |
| Ex. 49 | — | — | 10,000 ppm | 11,000 |
| | | P1 type | | |
| Ex. 50 | APO | 1,000 ppm | 5,000 ppm | 7,000 |
| Ex. 51 | Irgacure 184 | 10,000 ppm | 5,000 ppm | 8,000 |

TABLE 8-continued

|  | Photoinitiator | Addition Amount | Amount of (CaAlCp)CpFe | Photo-curability (mJ/cm$^2$) |
|---|---|---|---|---|
| Ex. 52 | Irgacure 651 | 10,000 ppm | 5,000 ppm | 10,000 |
| Ex. 53 | Vicure 55 | 5,000 ppm | 1,000 ppm | 8,000 |
| | P2 type | | | |
| Comp. Ex. 32 | benzophenone | 5,000 ppm | 5,000 ppm | 14,000 |
| Comp. Ex. 33 | benzanthrone | 1,000 ppm | 5,000 ppm | 15,000 |
| Comp. Ex. 34 | phenanthrene-quinone | 1,000 ppm | 5,000 ppm | 13,000 |

EXAMPLES 54 TO 71

In Example 54 to 71, various metallocene compounds each alone was added to TB1741 in a predetermined amount to obtain a photocurable cyanoacrylate composition.

The photocurability of each of the compositions was evaluated by placing 1 g of a sample in a polyethylene tray with an inner diameter of 30 mm and irradiating the sample with light to measure the integrated quantity of light needed for curing. The results of Examples 54 to 71 are shown in Table 9.

TABLE 9

|  | Photoinitiator | Addition Amount | Photocurability (mJ/cm$^2$) |
|---|---|---|---|
| Ex. 54 | (AcCp)CpFe | 5,000 ppm | 12,000 |
| Ex. 55 | (MeCp)$_2$Fe | 500 ppm | 5,000 |
| Ex. 56 | (MeCp)$_2$Fe | 1,000 ppm | 4,000 |
| Ex. 57 | (MeCp)$_2$Fe | 3,000 ppm | 1,000 |
| Ex. 58 | (BzoCp)$_2$Fe | 500 ppm | 1,000 |
| Ex. 59 | (AcCp)$_2$Fe | 100 ppm | 13,000 |
| Ex. 60 | (AcCp)$_2$Fe | 300 ppm | 5,000 |
| Ex. 61 | (AcCp)$_2$Fe | 500 ppm | 2,000 |
| Ex. 62 | (AcCp)$_2$Fe | 1,000 ppm | 1,000 |
| Ex. 63 | (Me$_5$Cp)$_2$Fe | 50 ppm | 3,000 |
| Ex. 64 | (Me$_5$Cp)$_2$Fe | 100 ppm | 1,000 |
| Ex. 65 | (Me$_5$Cp)$_2$Fe | 100 ppm | 8,000 |
| Ex. 66 | (Me$_5$Cp)$_2$Fe | 300 ppm | 4,000 |
| Ex. 67 | (Me$_5$Cp)$_2$Fe | 500 ppm | 2,000 |
| Ex. 68 | (Me$_5$Cp)$_2$Fe | 1,000 ppm | 1,000 |
| Ex. 69 | Cp$_2$Ru | 50 ppm | 3,000 |
| Ex. 70 | Cp$_2$Ru | 100 ppm | 2,000 |
| Ex. 71 | Cp$_2$Ru | 390 ppm | 1,000 |

Remarks:
(AcCp)CpFe: acetylferrocene
(MeCp)$_2$Fe: 1,1'-dimethylferrocene
(BzoCp)$_2$Fe: 1,1'-dibenzoylferrocene
(AcCp)$_2$Fe: di(acetylcyclopentadienyl)iron
(Me$_5$Cp)$_2$Fe: bis(pentamethylcyclopentadienyl)iron
(Me$_5$Cp)$_2$Os: bis(pentamethylcyclopentadienyl)osmium
Cp$_2$Ru: bis(cyclopentadienyl)ruthenium

EXAMPLES 72 TO 76

In Examples 72 to 76, Cp$_2$Fe as a metallocene compound and APO as a P1 type photoinitiator was added to TB1741 in predetermined amounts to obtain photocurable cyanoacrylate compositions.

COMPARATIVE EXAMPLES 35 TO 37

In Examples 35 to 37, Cp$_2$Fe as a metallocene compound and various P2 type photoinitiators were added to TB1741 in predetermined amounts to obtain-cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results of Examples 72 to 76 and Comparative Examples 35 to 37 are shown in Table 10.

TABLE 10

|  | Amount of APO | Amount of Cp$_2$Fe | Photocurability (mJ/cm$^2$) |
|---|---|---|---|
| Ex. 72 | 1,000 ppm | 500 ppm | 10,000 |
| Ex. 73 | 1,000 ppm | 1,000 ppm | 8,000 |
| Ex. 74 | 2,000 ppm | 100 ppm | 3,000 |
| Ex. 75 | 2,000 ppm | 500 ppm | 1,000 |
| Ex. 76 | 3,000 ppm | 500 ppm | 1,000 |
| Comp. Ex. 35 | 1,000 ppm | — | 20,000< |
| Comp. Ex. 36 | 2,000 ppm | — | 20,000< |
| Comp. Ex. 37 | 3,000 ppm | — | 20,000< |

EXAMPLES 77 TO 81

In Examples 77 to 81, (EtCp)CpFe as a metallocene compound and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained ate shown in Table 11.

TABLE 11

|  | Amount of APO | Amount of (EtCp)CpFe | Photocurability (mJ/cm$^2$) |
|---|---|---|---|
| Ex. 77 | 1,000 ppm | 500 ppm | 3,000 |
| Ex. 78 | 1,000 ppm | 1,000 ppm | 1,000 |
| Ex. 79 | 2,000 ppm | 50 ppm | 1,000 |
| Ex. 80 | 2,000 ppm | 100 ppm | 1,000 |
| Ex. 81 | 3,000 ppm | 500 ppm | 1,000 |

EXAMPLES 82 to 86

In Examples 82 to 86, (BuCp)CpFe as a metallocene compound and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 12.

TABLE 12

|  | Amount of APO | Amount of (BuCp)CpFe | Photocurability (mJ/cm$^2$) |
|---|---|---|---|
| Ex. 82 | 1,000 ppm | 500 ppm | 3,000 |
| Ex. 83 | 1,000 ppm | 1,000 ppm | 2,000 |
| Ex. 84 | 2,000 ppm | 100 ppm | 1,000 |
| Ex. 85 | 2,000 ppm | 500 ppm | 1,000 |
| Ex. 86 | 3,000 ppm | 500 ppm | 1,000 |

EXAMPLES 87 TO 91

In Examples 87 to 91, (AmCp)CpFe as a metallocene compound and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 13.

TABLE 13

| | Amount of APO | Amount of (AmCp)CpFe | Photocurability (mJ/cm$^2$) |
|---|---|---|---|
| Ex. 87 | 1,000 ppm | 500 ppm | 4,000 |
| Ex. 88 | 1,000 ppm | 1,000 ppm | 2,000 |
| Ex. 89 | 2,000 ppm | 100 ppm | 1,000 |
| Ex. 90 | 2,000 ppm | 500 ppm | 1,000 |
| Ex. 91 | 3,000 ppm | 500 ppm | 1,000 |

EXAMPLES 92 AND 93

In Examples 92 and 93, (BzoCp)CpFe as a metallocene compound and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 14.

TABLE 14

| | Amount of APO | Amount of (BzoCp)CpFe | Photocurability (mJ/cm$^2$) |
|---|---|---|---|
| Ex. 92 | 2,000 ppm | 1,000 ppm | 4,000 |
| Ex. 93 | 3,000 ppm | 1,000 ppm | 1,000 |

EXAMPLES 94 TO 96

In Examples 94 TO 96, (CyheCp)CpFe as a metallocene compound and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 15.

TABLE 15

| | Amount of APO | Amount of (CyheCp)CpFe | Photocurability (mJ/cm$^2$) |
|---|---|---|---|
| Ex. 94 | 2,000 ppm | 500 ppm | 1,000 |
| Ex. 95 | 2,000 ppm | 1,000 ppm | 1,000 |
| Ex. 96 | 3,000 ppm | 500 ppm | 1,000 |

EXAMPLES 97 AND 98

In Examples 97 and 98, (CypeCp)CpFe as a metallocene compound and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 16.

TABLE 16

| | Amount of APO | Amount of (CypeCp)CpFe | Photocurability (mJ/cm$^2$) |
|---|---|---|---|
| Ex. 97 | 2,000 ppm | 1,000 ppm | 2,000 |
| Ex. 98 | 3,000 ppm | 500 ppm | 1,000 |

EXAMPLES 99 TO 101

In Examples 99 to 101, (CaAlCp)CpFe as a metallocene compound and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 17.

TABLE 17

| | Amount of APO | Amount of (CaAlCp)CpFe | Photocurability (mJ/cm$^2$) |
|---|---|---|---|
| Ex. 99 | 2,000 ppm | 1,000 ppm | 4,000 |
| Ex. 100 | 3,000 ppm | 500 ppm | 4,000 |
| Ex. 101 | 3,000 ppm | 1,000 ppm | 1,000 |

EXAMPLES 102 TO 112

In Examples 102 to 109, 1,1'-di-n-butylferrocene, bis(pentamethylcyclopentadienyl)ruthenium, and bis(cyclopentadienyl)osmium (hereinafter referred to as (BuCp)$_2$Fe, (Me$_5$Cp)$_2$Ru, and Cp$_2$Os, respectively) as metallocene compounds alone were added to TB1741 in respective predetermined amounts to obtain photocurable cyanoacrylate compositions.

In Examples 110 to 112, (BuCp)$_2$Fe, (Me$_5$Cp)$_2$Ru, and Cp$_2$Os as metallocene compounds and APO as a P1 type photoinitiator were added to TB1741 in predetermined amounts to obtain photocurable cyanoacrylate compositions.

The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 18.

TABLE 18

| | Metallocene Compound | Addition Amount | Addition Amount of APO | Photocurability (mJ/cm$^2$) |
|---|---|---|---|---|
| Ex. 102 | (BuCp)$_2$Fe | 500 ppm | — | 5,000 |
| Ex. 103 | (BuCp)$_2$Fe | 1,000 ppm | — | 2,000 |
| Ex. 104 | (Me$_5$Cp)$_2$Ru | 3,000 ppm | — | 8,000 |
| Ex. 105 | (Me$_5$Cp)$_2$Ru | 5,000 ppm | — | 6,000 |
| Ex. 106 | Cp$_2$Os | 100 ppm | — | 13,000 |
| Ex. 107 | Cp$_2$Os | 300 ppm | — | 10,000 |
| Ex. 108 | Cp$_2$Os | 500 ppm | — | 5,000 |
| Ex. 109 | Cp$_2$Os | 1,000 ppm | — | 3,000 |
| Ex. 110 | (BuCp)$_2$Fe | 500 ppm | 2,000 ppm | 1,000 |
| Ex. 111 | (Me$_5$Cp)$_2$Ru | 3,000 ppm | 2,000 ppm | 2,000 |
| Ex. 112 | Cp$_2$Os | 500 ppm | 2,000 ppm | 1,000 |

EXAMPLES 113 TO 117 AND COMPARATIVE EXAMPLE 38

(AcCp)$_2$Fe was added to TB1741 in predetermined amounts to obtain photocurable cyanoacrylate compositions. In a storage stability test, 20 g of each sample was placed in a light-shielded polyethylene container, stored at 70° C. for 1 week, and then examined for viscosity and photocurability. Photocurability was evaluated by placing 1 g of a sample in a polyethylene tray with an inner diameter of 30 mm and irradiating the sample with light to measure the integrated quantity of light needed for curing. Viscosity was measured at room temperature with a Brookfield viscometer (manufactured by Tokyo Keiki Co., Ltd.) fitted with an adapter. The results obtained are shown in Table 19.

TABLE 19

|  | Comp. Ex. 38 | Ex. 113 | Ex. 114 | Ex. 115 | Ex. 116 | Ex. 117 |
|---|---|---|---|---|---|---|
| Amount of (AcCp)$_2$Fe Blank | 0 ppm | 100 ppm | 300 ppm | 500 ppm | 1,000 ppm | 1,500 ppm |
| Viscosity (mPa · s) | 1.90 | 2.00 | 2.10 | 2.00 | 1.90 | 1.95 |
| Photocurability 70° C. × 1 W | — | 13,000 | 5,000 | 2,000 | 1,000 | 1,000 |
| Viscosity (mPa · s) | 1.95 | 2.05 | 2.10 | 2.15 | 2.60 | 4.35 |
| Photocurability | — | 14,000 | 6,000 | 2,000 | 1,000 | 1,000 |

Photocurability is shown in terms of the integrated quantity of light (mJ/cm$^2$) needed for complete photocuring.

EXAMPLES 118 TO 121

To TB1741 were added (AcCp)$_2$Fe in an amount of 1,000 ppm and either a radical-polymerization inhibitor (hydroquinone) or an anionic-polymerization inhibitor (p-toluenesulfonic acid) in predetermined amounts. The compositions obtained were evaluated for photocurability in the same manner as in Examples 1 to 39 to ascertain that the photocuring reaction proceeded by anionic polymerization. The results obtained are shown in Table 20.

TABLE 20

| Example No. | 62 | 118 | 119 | 120 | 121 |
|---|---|---|---|---|---|
| (AcCp)$_2$Fe | 1,000 | 1,000 | 1,000 | 1,000 | 1,000 |
| Hydroquinone | — | 1,000 | 3,000 | — | — |
| p-Toluenesulfonic acid | — | — | — | 1,000 | 3,000 |
| Photocurability (mJ/cm$^2$) | 1,000 | 1,000 | 1,000 | x | x |

The numerals in the table indicate addition amounts (ppm) based on TB1741.
x: The sample remained uncured even after light irradiation in an integrated quantity of light of 10,000 mJ/cm$^2$.

EXAMPLES 122 AND 123

(AcCp)$_2$Fe was added to each of methyl α-cyanoacrylate (hereinafter abbreviated as MCA) and ethoxyethyl α-cyanoacrylate (hereinafter abbreviated as EECA) as α-cyanoacrylates in an amount of 1,000 ppm. The compositions were evaluated for photocurability in the same manner as in Examples 1 to 39. The results obtained are shown in Table 21.

TABLE 21

| Example No. | 62 | 122 | 123 |
|---|---|---|---|
| α-Cyanoacrylate | TB1741 | MCA | EECA |
| Photocurability (mJ/cm$^2$) | 1,000 | 1,000 | 1,000 |

Photocurability is shown in terms of the integrated quantity of light (mJ/cm$^2$) needed for complete photocuring.

EXAMPLES 124 AND 125

In Examples 124 and 125, Cp$_2$Fe as a metallocene compound and APO as a P1 type photoinitiator were added in amounts of 500 ppm and 2,000 ppm, respectively, to each of methyl α-cyanoacrylate (hereinafter abbreviated as MCA) and ethoxyethyl α-cyanoacrylate (hereinafter abbreviated as EECA) as α-cyanoacrylates to obtain photocurable cyanoacrylate compositions. The photocurability of each of the compositions was evaluated by placing 1 g of a sample in a polyethylene tray with an inner diameter of 30 mm and irradiating the sample with light to measure the integrated quantity of light needed for curing. The results obtained are shown in Table 22.

TABLE 22

|  | α-Cyanoacrylate | Photocurability (mJ/cm$^2$) |
|---|---|---|
| Ex. 75 | TB1741 | 1,000 |
| Ex. 124 | MCA | 1,000 |
| Ex. 125 | EECA | 1,000 |

The composition of the present invention, i.e., the photocurable composition comprising an α-cyanoacrylate and a metallocene compound or the composition thereof further comprising a cleavage-type photoinitiator, can be rapidly cured by light irradiation even when the gap between a pair of adherends is wide, when the composition applied has overflown from the bonding part, or when the composition applied is not sandwiched between a pair of adherends as in coating. Since the curing reaction proceeds by anionic polymerization, not only the composition does not suffer the curing inhibition by oxygen which is observed in radical polymerization, but also even that part of the composition to which light cannot reach due to the shape of the substrate cures by the anionic polymerization initiated by light irradiation. Further, since the metallocene compound has a light absorption wavelength region extending beyond 500 nm to the longer-wavelength side, the composition can be cured with a light in a wider wavelength region, i.e., even with ultraviolet and/or visible light.

In the composition further comprising a cleavage-type photoinitiator, curing speed of a photocurable composition comprising an α-cyanoacrylate and a metallocene compound under light irradiation can be significantly increased by appropriately selecting a kind of the cleavage-type photoinitiator to be used. Furthermore, the effective wavelength of the light necessary to cure the composition is controlled in this case.

Since the addition of a cleavage-type photoinitiator reduces the addition amount of the metallocene compound, which is relatively expensive component of the composition of the present invention, the use of the cleavage-type photoinitiator decreases the total cost of the adhesive composition of the present invention. Metallocene compounds, when dissolved in an α-cyanoacrylate, sometimes color the solution of the composition; even so, reducing the amount of the metallocene compound is effective in maintaining the colorlessness and transparency of the composition.

Moreover, in the composition further comprising a cleavage-type photoinitiator, since the cleavage-type photoinitiator functions as an initiator for anionic polymerization, even when the composition contains a radical-polymerizable compound such as an acrylic compound, it can be rapidly cured due to the cleavage type photoinitiator contained therein. In the case where the cleavage-type photoinitiator used is a peroxide, heating can also be used to cure the composition. In the case where the cleavage type photoinitiator used is an azo compound, the composition can be foamed by regulating the addition amount of the photoinitiator or the quantity of light with which the composition is irradiated.

While the invention has been described in detail and with reference to specific embodiments thereof, it will be apparent to one skilled in the art that various changes and modifications can be made therein without departing from the spirit and scope thereof.

What is claimed is:

1. A photocurable composition comprising:
   (A) an α-cyanoacrylate,
   (B) a metallocene compound comprising a transition metal of group VIII of the periodic table and aromatic electron system ligands, and
   (C) a cleavage photoinitiator,
      said metallocene compound (B) comprising a transition metal of Group VIII of the periodic table and said aromatic electron system ligands being represented by the following formula (I):

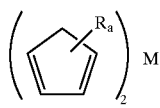

(I)

wherein M represents a transition metal of Group VIII of the periodic table: R represents a halogen atom, a hydrocarbon group having 1 to 20 carbon atoms, a halogenated hydrocarbon group having 1 to 20 carbon atoms, or a silicon-atom containing, oxygen-atom containing, sulfur-atom containing, or phosphorus atom containing group having 1 to 20 carbon atoms, provided that the R's may be the same or different and may be crosslinked to each other; symbol a represents an integer of from 0 to 5; and the groups $R_a$-Cp, wherein CP represents η-cyclopentadienyl, may be the same or different.

2. The photocurable composition as claimed in claim 1, wherein the transition metal of Group VIII of the periodic table in the metallocene compound (B) comprises iron, osmium, ruthenium, cobalt or nickel.

3. The photocurable composition as claimed in claim 2, wherein the transition metal of Group VIII of the periodic table in the metallocene compound (B) comprises iron, osmium or ruthenium.

4. The photocurable composition according to claim 1, wherein photocurability is achieved with photoexposure of about 20,000 mJ/cm² or less.

5. The photocurable composition according to claim 1, wherein photocurability is achieved with photoexposure of about 15,000 mJ/cm².

6. The photocurable composition according to claim 1, wherein photocurability is achieved with photoexposure of about 12,000 mJ/cm².

7. The photocurable composition according to claim 1, wherein photocurability is achieved with photoexposure of about 9,000 mJ/cm².

8. The photocurable composition according to claim 1, wherein photocurability is achieved with photoexposure of about 7,000 mJ/cm².

9. The photocurable composition according to claim 1, wherein photocurability is achieved with photoexposure of about 5,000 mJ/cm².

10. The photocurable composition according to claim 1, wherein photocurability is achieved with photoexposure of about 3,000 mJ/cm².

11. The photocurable composition according to claim 1, wherein photocurability is achieved with photoexposure of about 1,000 mJ/cm².

12. The photocurable composition according to claim 1, wherein photocuring initiates an anionic polymerization reaction.

13. The photocurable composition according to claim 1, wherein the cleavage photoinitiator is selected from the group consisting of 2-hydroxy-2-methyl-1-phenylpropan-1-one, 2-methyl-1-(4-(methylthio)phenyl)-2-morpholinopropane-1 and 1-hydroxycyclohexyl phenyl ketone.

14. A photocurable composition according to claim 1, wherein the cleavage photoinitiator is a peroxide.

15. A photocurable composition according to claim 1, wherein the cleavage photoinitiator is an azo compound.

16. A photocurable composition according to claim 15, wherein the azo compound is 2,2'-azobis(2-methylbutyronitrile).

17. A photocurable composition according to claim 1, wherein the sum of the two a's of the two Ra's as substituents on the metallocene compound is 0 or 1.

18. A photocurable composition comprising:
   (A) an α-cyanoacrylate,
   (B) a metallocene compound comprising a transition metal of Group VIII of the periodic table and aromatic electron system ligands, and
   (C) a cleavage photoinitiator,
      said metallocene compound (B) comprising a transition metal of Group VIII of the periodic table and said aromatic electron system ligands being represented by the following formula (I):

(I)

wherein M represents a transition metal of Group VIII of the periodic table; R represents a halogen atom, a hydrocarbon group having 1 to 20 carbon atoms, or an oxygen-atom containing group having 1 to 20 carbon atoms provided that the R's may be the same or different and may be crosslinked to each other, symbol a represents an integer of from 0–5; and the groups $R_a$-Cp, wherein Cp represents η-cyclopentyldienyl, may be the same or different.

* * * * *

UNITED STATES PATENT AND TRADEMARK OFFICE
CERTIFICATE OF CORRECTION

PATENT NO.     : 6,503,959 B1
DATED          : January 7, 2003
INVENTOR(S)    : Yukou Nishiyama and Hiroyuki Mikuni It is certified that error appears in the above-identified patent and that said Letters Patent is hereby corrected as shown below:

<u>Title page,</u>
Item [*] Notice, delete "by 0 days" and insert -- by 476 days --

Signed and Sealed this

Fifth Day of August, 2003

JAMES E. ROGAN
*Director of the United States Patent and Trademark Office*